(12) United States Patent
Hatano et al.

(10) Patent No.: US 8,188,474 B2
(45) Date of Patent: May 29, 2012

(54) FLEXIBLE LIGHT-EMITTING DEVICE

(75) Inventors: Kaoru Hatano, Atsugi (JP); Satoshi Seo, Kawasaki (JP); Takaaki Nagata, Atsugi (JP); Tatsuya Okano, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 351 days.

(21) Appl. No.: 12/578,687

(22) Filed: Oct. 14, 2009

(65) Prior Publication Data

US 2010/0096633 A1 Apr. 22, 2010

(30) Foreign Application Priority Data

Oct. 16, 2008 (JP) ................................. 2008-267774
May 21, 2009 (JP) ................................. 2009-123451

(51) Int. Cl.
| | |
|---|---|
| *H01L 29/04* | (2006.01) |
| *H01L 29/10* | (2006.01) |
| *H01L 31/036* | (2006.01) |
| *H01L 31/0376* | (2006.01) |
| *H01L 31/20* | (2006.01) |
| *H01L 29/15* | (2006.01) |
| *H01L 27/148* | (2006.01) |
| *H01L 29/74* | (2006.01) |
| *H01L 29/768* | (2006.01) |
| *H01L 31/062* | (2006.01) |
| *H01L 31/113* | (2006.01) |

(52) U.S. Cl. ............ 257/59; 257/72; 257/222; 257/291; 257/E23.065; 257/E23.177; 257/E31.001; 257/E33.001

(58) Field of Classification Search .................... 257/59, 257/72, 222, 291, E23.065, E23.177, E31.001, 257/E33.001
See application file for complete search history.

(56) References Cited

U.S. PATENT DOCUMENTS 5,107,175 A 4/1992 Hirano et al.
(Continued)

FOREIGN PATENT DOCUMENTS

JP 2003-204049 7/2003

OTHER PUBLICATIONS

Kim et al., "Thin Film Passivation for Longevity of Organic Light-Emitting Devices and Organic Thin-Film Transistor," IDW '03, 2003, pp. 387-390.

(Continued)

*Primary Examiner* — Ida M Soward
(74) *Attorney, Agent, or Firm* — Eric J. Robinson; Robinson Intellectual Property Law Office, P.C.

(57) ABSTRACT

It is an object to provide a flexible light-emitting device with long lifetime in a simple way and to provide an inexpensive electronic device with long lifetime using the flexible light-emitting device. A flexible light-emitting device is provided, which includes a substrate having flexibility and a light-transmitting property with respect to visible light; a first adhesive layer over the substrate; an insulating film containing nitrogen and silicon over the first adhesive layer; a light-emitting element including a first electrode, a second electrode facing the first electrode, and an EL layer between the first electrode and the second electrode; a second adhesive layer over the second electrode; and a metal substrate over the second adhesive layer, wherein the thickness of the metal substrate is 10 μm to 200 μm inclusive. Further, an electronic device using the flexible light-emitting device is provided.

32 Claims, 12 Drawing Sheets

U.S. PATENT DOCUMENTS

| | | | |
|---|---|---|---|
| 5,124,204 A | 6/1992 | Yamashita et al. | |
| 5,189,405 A | 2/1993 | Yamashita et al. | |
| 5,686,360 A | 11/1997 | Harvey et al. | |
| 5,693,956 A | 12/1997 | Shi et al. | |
| 5,757,126 A | 5/1998 | Harvey et al. | |
| 5,771,562 A | 6/1998 | Harvey et al. | |
| 5,811,177 A | 9/1998 | Shi et al. | |
| 5,952,778 A | 9/1999 | Haskai et al. | |
| 6,146,225 A | 11/2000 | Sheats et al. | |
| 6,150,187 A | 11/2000 | Zyung et al. | |
| 6,198,217 B1 | 3/2001 | Suzuki et al. | |
| 6,198,220 B1 | 3/2001 | Jones et al. | |
| 6,294,478 B1 | 9/2001 | Sakaguchi et al. | |
| 6,372,608 B1 | 4/2002 | Shimoda et al. | |
| 6,413,645 B1 | 7/2002 | Graff et al. | |
| 6,492,026 B1 | 12/2002 | Graff et al. | |
| 6,506,664 B1 | 1/2003 | Beynee et al. | |
| 6,521,511 B1 | 2/2003 | Inoue et al. | |
| 6,522,067 B1 | 2/2003 | Graff et al. | |
| 7,129,102 B2 * | 10/2006 | Yamazaki | 438/22 |
| 7,178,927 B2 | 2/2007 | Seo | |
| 7,229,900 B2 | 6/2007 | Takayama et al. | |
| 7,332,381 B2 | 2/2008 | Maruyama et al. | |
| 7,341,924 B2 * | 3/2008 | Takayama et al. | 438/455 |
| 7,685,706 B2 * | 3/2010 | Maruyama et al. | 29/846 |
| 7,952,107 B2 * | 5/2011 | Daniels et al. | 257/80 |
| 8,044,946 B2 * | 10/2011 | Yamazaki et al. | 345/204 |
| 2001/0020922 A1 | 9/2001 | Yamazaki et al. | |
| 2002/0125817 A1 | 9/2002 | Yamazaki et al. | |
| 2006/0145603 A1 | 7/2006 | Taniguchi et al. | |
| 2007/0029554 A1 * | 2/2007 | Nakamura et al. | 257/72 |
| 2007/0122960 A1 * | 5/2007 | Aoki | 438/197 |
| 2008/0191220 A1 * | 8/2008 | Daniels et al. | 257/88 |
| 2008/0230179 A1 * | 9/2008 | Ishitani et al. | 156/295 |
| 2009/0023232 A1 | 1/2009 | Taniguchi et al. | |

OTHER PUBLICATIONS

Jin et al., "4.1: 5.6-Inch Flexible Full Color Top Emission AMOLED Display on Stainless Steel Foil," SID Digest '06: SID International Symposium Digest of Technical Papers, 2006, vol. XXXVII, Book. II, pp. 1855-1857.

Chwang et al., "64.2: Full Color 100 dpi AMOLED Displays on Flexible Stainless Steel Substrates," SID Digest '06: SID International Symposium Digest of Technical Papers, 2006, vol. XXXVII, Book II, pp. 1858-1861.

* cited by examiner

FIG. 3A
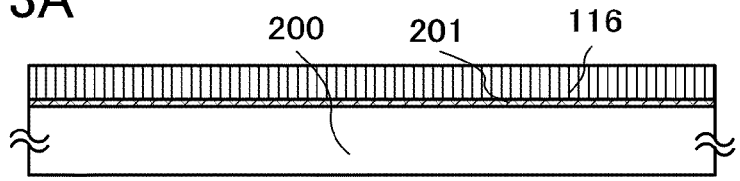
FIG. 3B
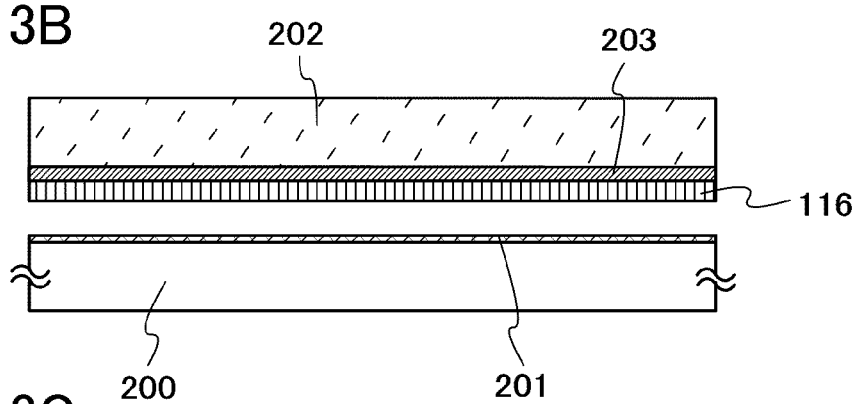
FIG. 3C
FIG. 3D
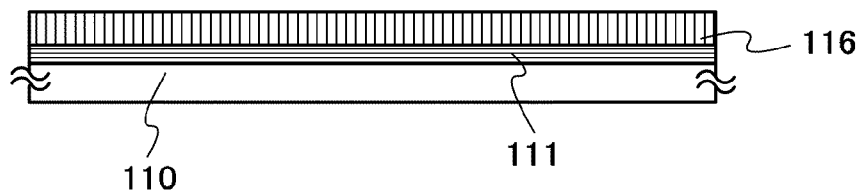
FIG. 3E
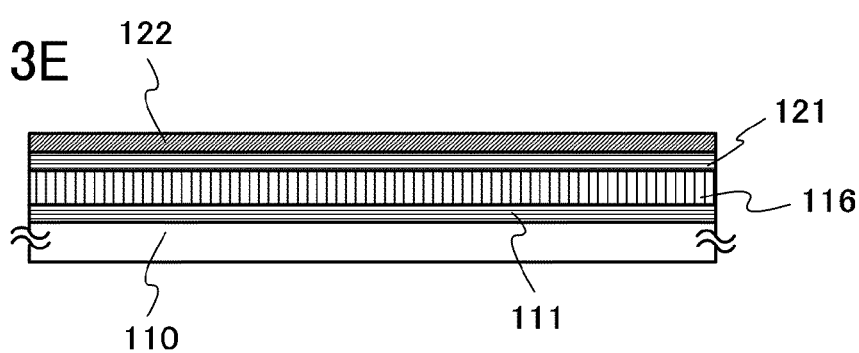

FLEXIBLE LIGHT-EMITTING DEVICE

BACKGROUND OF THE INVENTION

1. Field of the Invention

The present invention relates to a light-emitting device and a method for manufacturing the light-emitting device. Further, the present invention relates to an electronic device on which the light-emitting device is mounted.

2. Description of the Related Art

In recent years, technological development has been remarkably made in the field of displays. In particular, the needs of the market have stimulated tremendous progress in the technology directed to increase in resolution of displays and thinning of displays.

In the next phase of this field, focus is placed on commercialization of a flexible display having a curved display area, and a variety of proposals have been made on manufacturing the flexible display (for example, Patent Document 1). A light-emitting device using a flexible substrate can be highly lightweight compared to the case of using a glass substrate or the like.

However, in commercialization of such a flexible display, the biggest problem is its short lifetime.

The lifetime of the flexible display is short because, for a substrate which should support a light-emitting element and protect the element from moisture, oxygen, or the like of the surroundings, a glass substrate that is not flexible cannot be used, and instead, a plastic substrate which has flexibility but high permeability and low heat resistance has to be used. Since the heat resistance of the plastic substrate is low, a protective film with high quality which needs a high-temperature process cannot be formed, and moisture entering through the plastic substrate has a great influence on the lifetime of the light-emitting element, furthermore, the light-emitting device. In Non-Patent Document 1, for example, an example in which a light-emitting element is formed over a substrate including polyethersulfone (PES) as a base and is sealed with an aluminum film to form a flexible light-emitting device is introduced; however, its lifetime is about 230 hours and the light-emitting device is miles away from commercialization. In Non-Patent Documents 2 and 3, an example of a flexible light-emitting device in which a light-emitting element is formed over a stainless steel substrate is introduced. In this flexible light-emitting device, moisture is prevented from entering through the stainless steel substrate; however, moisture cannot be prevented effectively from entering from the light-emitting element side. Therefore, as an attempt to improve the lifetime of the flexible light-emitting device, it is manufactured over the stainless steel substrate, and a sealing film obtained by repeatedly stacking plural kinds of materials is employed for the light-emitting element side.

Although a metal thin film such as an aluminum film or a stainless steel substrate has both flexibility and low permeability, it does not transmit visible light therethrough with a normal thickness. Thus, in the light-emitting device, a metal thin film or a stainless steel substrate is used for only one of a pair of substrates which sandwich a light-emitting element.

REFERENCE

[Patent Document]
[Patent Document 1]
Japanese Published Patent Application No. 2003-204049
[Non Patent Document]
[Non Patent Document 1]
Gi Heon Kim et al., IDW'03, 2003, pp. 387-390

[Non Patent Document 2]
Dong Un Jin et al., SID 06 DIGEST, 2006, pp. 1855-1857
[Non Patent Document 3]
Anna Chwang et al., SID 06 DIGEST, 2006, pp. 1858-1861

SUMMARY OF THE INVENTION

In Non Patent Document 1, the lifetime of the light-emitting device is short, and the reason is probably as follows: although moisture is prevented from entering from an upper portion which is sealed with an aluminum film, moisture cannot be prevented from entering through the PES substrate. In addition, the heat resistance of the light-emitting element used for such a light-emitting device is low, and thus, it is difficult to form a protective film with high quality after forming the light-emitting element.

In Non Patent Documents 2 and 3, it seems that the lifetime of the light-emitting device is the same as that of a light-emitting device interposed between glass substrates; however, this lifetime is achieved since a sealing film obtained by repeatedly stacking plural kinds of materials as described above is used, and the productivity is low. The low productivity results in a high price, and such a light-emitting device is not realistic.

As described above, in a flexible light-emitting device, since a plastic substrate which has lower heat resistance than a conventionally-used glass substrate has been used, a dense protective film which is formed at high temperature cannot be used and the lifetime of a light-emitting element or a light-emitting device has been short. Furthermore, a sealing film which is used for complementing the plastic substrate is poor in productivity.

In addition, since a plastic substrate is used for a flexible light-emitting device, a flexible light-emitting device is more often electrically charged than a light-emitting device using a glass substrate or the like. Therefore, in a flexible light-emitting device, a malfunction due to some sort of cause could possibly occur, for example, a malfunction due to static electricity may occur when static electricity is discharged from human bodies and electric charge is accumulated in a flexible light-emitting device.

In view of the above, it is an object of one embodiment of the present invention to provide a flexible light-emitting device with long lifetime in a simple way. In addition, it is another object to provide an electronic device using the flexible light-emitting device. Further, it is still another object to provide a flexible light-emitting device which is resistant to static electricity.

The above object can be achieved with a flexible light-emitting device which is manufactured in the following manner. That is, a protective film is formed over a substrate with high heat resistance such as a glass substrate at an appropriate temperature so as to have sufficiently low permeability, and necessary components such as a thin film transistor (hereinafter also referred to a TFT) and an electrode of a light-emitting element or a TFT and a light-emitting element are formed over the protective film. After that, the necessary components are transferred to a plastic substrate together with the protective film, and finally, a metal substrate is adhered thereto using an adhesive.

That is, one embodiment of the invention disclosed in this specification is a flexible light-emitting device which includes: a substrate having flexibility and a light-transmitting property with respect to visible light; a first adhesive layer provided over the substrate; an insulating film containing nitrogen and silicon provided over the first adhesive layer; a light-emitting element including a first electrode provided over the insulating film, a second electrode facing the first electrode, and an EL layer provided between the first electrode and the second electrode; a second adhesive layer provided over the second electrode; and a metal substrate provided over the second adhesive layer, wherein the thickness of the metal substrate is 10 µm to 200 µm inclusive.

In addition, another embodiment of the invention disclosed in this specification is a flexible light-emitting device which includes: a substrate having flexibility and a light-transmitting property with respect to visible light; a first adhesive layer provided over the substrate; an insulating film containing nitrogen and silicon provided over the first adhesive layer; a thin film transistor formation layer (hereinafter referred to a TFT formation layer) provided over the insulating film; a light-emitting element including a first electrode which is electrically connected to a part of a TFT provided in the TFT formation layer, a second electrode facing the first electrode, and an EL layer provided between the first electrode and the second electrode; a second adhesive layer provided over the second electrode; and a metal substrate provided over the second adhesive layer, wherein the thickness of the metal substrate is 10 µm to 200 µm inclusive.

In addition, another embodiment of the invention disclosed in this specification is a flexible light-emitting device having the above structure, wherein an active layer of the TFT formed in the TFT formation layer is formed using crystalline silicon.

In addition, another embodiment of the invention disclosed in this specification is a flexible light-emitting device having the above structure which further includes: a pixel portion including a plurality of light-emitting elements; and a driver circuit portion provided outside the pixel portion, wherein the driver circuit portion includes a TFT formed in the TFT formation layer.

In addition, another embodiment of the invention disclosed in this specification is a flexible light-emitting device having the above structure, wherein a film sealing layer is formed between the second electrode of the light-emitting element and the second adhesive layer.

In addition, another embodiment of the invention disclosed in this specification is a flexible light-emitting device having the above structure, wherein the metal substrate is formed using a material such as stainless steel, aluminum, copper, nickel, or an aluminum alloy.

In addition, another embodiment of the invention disclosed in this specification is a flexible light-emitting device having the above structure, wherein the first adhesive layer is formed using at least one of an epoxy resin, an acrylic resin, a silicone resin, and a phenol resin.

In addition, another embodiment of the invention disclosed in this specification is a flexible light-emitting device having the above structure, wherein the second adhesive layer is formed using at least one of an epoxy resin, an acrylic resin, a silicone resin, and a phenol resin.

In addition, another embodiment of the invention disclosed in this specification is a flexible light-emitting device having the above structure, wherein a resin layer is further provided over the metal substrate.

In addition, another embodiment of the invention disclosed in this specification is a flexible light-emitting device having the above structure, wherein the resin layer includes at least one of thermal curable resins such as an epoxy resin, an acrylic resin, a silicone resin, a phenol resin, and a polyester resin, or at least one of thermoplastic resins such as polypropylene, polyethylene, polycarbonate, polystyrene, polyamide, polyetherketone, a fluorine resin, and polyethylenenaphthalate.

In addition, another embodiment of the invention disclosed in this specification is a flexible light-emitting device having the above structure, wherein at least one of the substrate having flexibility and a light-transmitting property with respect to visible light, the first adhesive layer, the second adhesive layer, and the resin layer includes a fibrous body.

In addition, another embodiment of the invention disclosed in this specification is a flexible light-emitting device having the above structure, wherein a film having low permeability is formed between the substrate having flexibility and a light-transmitting property with respect to visible light and the first adhesive layer.

In addition, another embodiment of the invention disclosed in this specification is a flexible light-emitting device having the above structure, wherein the film having low permeability is a film containing silicon and nitrogen or a film containing aluminum and nitrogen.

In addition, another embodiment of the invention disclosed in this specification is a flexible light-emitting device having the above structure, wherein a coat film is provided over a surface of the substrate having flexibility and a light-transmitting property with respect to visible light, which is opposite to a surface facing the metal substrate.

In addition, another embodiment of the invention disclosed in this specification is a flexible light-emitting device having the above structure, wherein the coat film has a light-transmitting property with respect to visible light and high hardness. Further, when a conductive film having a light-transmitting property with respect to visible light is used for the coat film, the flexible light-emitting device can be protected from static electricity.

In addition, another embodiment of the invention disclosed in this specification is an electronic device using the flexible light-emitting device having the above structure for a display portion.

In addition, another embodiment of the invention disclosed in this specification is a method for manufacturing a flexible light-emitting device, which includes the steps of: forming a separation layer over a formation substrate; forming an insulating film containing nitrogen and silicon over the separation layer; forming a first electrode over the insulating film; forming a partition wall so as to cover an end portion of the first electrode; adhering a temporary supporting substrate to the first electrode and the partition wall; separating the insulating film, the first electrode, the partition wall, and the temporary supporting substrate from the formation substrate by using the separation layer; adhering a substrate having flexibility and a light-transmitting property with respect to visible light to a surface of the insulating film, which is exposed by the separation, using a first adhesive layer; removing the temporary supporting substrate to expose a surface of the first electrode; forming an EL layer containing an organic compound so as to cover the exposed first electrode; forming a second electrode so as to cover the EL layer; and adhering a metal substrate having a thickness of 10 µm to 200 µm inclusive to a surface of the second electrode using a second adhesive layer.

In addition, another embodiment of the invention disclosed in this specification is a method for manufacturing a flexible light-emitting device, which includes the steps of: forming a separation layer over a formation substrate; forming an insulating film containing nitrogen and silicon over the separation layer; forming a TFT formation layer including a plurality of TFTs over the insulating film; forming a first electrode which is electrically connected to a part of a TFT provided in the TFT formation layer, over the TFT formation layer; forming a partition wall so as to cover an end portion of the first electrode; adhering a temporary supporting substrate to the first electrode and the partition wall; separating the insulating film, the TFT formation layer, the first electrode, the partition wall, and the temporary supporting substrate from the formation substrate by using the separation layer; adhering a substrate having flexibility and a light-transmitting property with respect to visible light to a surface of the insulating film, which is exposed by the separation, using a first adhesive layer; removing the temporary supporting substrate to expose a surface of the first electrode; forming an EL layer containing an organic compound so as to cover the exposed first electrode; forming a second electrode so as to cover the EL layer; and adhering a metal substrate having a thickness of 10 µm to 200 µm inclusive to a surface of the second electrode using a second adhesive layer.

In addition, another embodiment of the invention disclosed in this specification is the above method for manufacturing a flexible light-emitting device, wherein, after the metal substrate is adhered, a resin layer is formed over the metal substrate.

In addition, another embodiment of the invention disclosed in this specification is the above method for manufacturing a flexible light-emitting device, wherein a film sealing layer is formed between the second electrode and the second adhesive layer.

In addition, another embodiment of the invention disclosed in this specification is the above method for manufacturing a flexible light-emitting device, wherein the insulating film is formed by a plasma CVD method at a temperature of 250° C. to 400° C. inclusive.

A light-emitting device according to one embodiment of the present invention is a flexible light-emitting device which has long lifetime and can be manufactured in a simple way even though it is flexible. In addition, one embodiment of the present invention can provide a method capable of manufacturing a flexible light-emitting device.

BRIEF DESCRIPTION OF THE DRAWINGS

FIGS. 3A to 3E illustrate a manufacturing process of a light-emitting device according to an embodiment.

DETAILED DESCRIPTION OF THE INVENTION

Figure 1A:
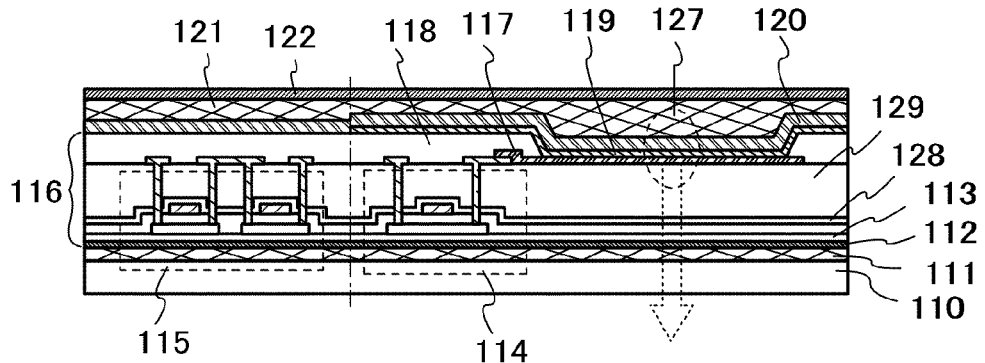
FIGS. 1A to 1C each illustrate a light-emitting device according to an embodiment.

Hereinafter, embodiments of the present invention will be described with reference to the accompanying drawings. However, the present invention can be carried out in many different modes, and it is easily understood by those skilled in the art that modes and details thereof can be modified in various ways without departing from the spirit and the scope of the present invention. Therefore, the present invention should not be interpreted as being limited to the description of the embodiments.

Embodiment 1

A light-emitting device in this embodiment is manufactured in the following manner: after a layer to be separated which includes a protective film (the layer to be separated may also include a TFT, a first electrode of a light-emitting element, a light-emitting element, and:Dor the like) is formed over a formation substrate having high heat resistance such as a glass substrate or a ceramic substrate with a separation layer interposed therebetween, the formation substrate and the layer to be separated are separated at the separation layer, and the layer to be separated which is separated is adhered to a plastic substrate using an adhesive. Therefore, the protective film which has sufficiently low permeability is provided over the high-permeability plastic substrate, and the light-emitting device in this embodiment has a first adhesive layer between the plastic substrate and the protective film. The plastic substrate in this specification is a substrate having flexibility and a light-transmitting property with respect to visible light. There is no particular limitation on the plastic substrate as long as it has flexibility and a light-transmitting property with respect to visible light, but it is preferable to use a polyester resin such as polyethylene terephthalate (PET) or polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinylchloride resin, or the like. In addition, the first adhesive layer is formed using a material having a light-transmitting property with respect to visible light. For example, any of a variety of types of curable adhesive, e.g., a light curable adhesive such as a UV curable adhesive, a reactive curable adhesive, a thermal curable adhesive, and an anaerobic adhesive can be used. As such an adhesive, an epoxy resin, an acrylic resin, a silicone resin, a phenol resin, or the like is used. The protective film is formed using a material having low permeability and a light-transmitting property with respect to visible light. For example, an insulating film containing nitrogen and silicon, such as a silicon nitride film, a silicon nitride oxide film, or a silicon oxynitride film is preferably used.

A metal substrate is used as a substrate which faces the plastic substrate with the light-emitting element interposed therebetween. The metal substrate employed has a thickness of 10 µm to 200 µm inclusive so as to be flexible. Note that a metal substrate with a thickness of 20 µm to 100 µm inclusive is preferable because of its high flexibility. A material of the metal substrate is not limited to a particular material, but it is preferable to use aluminum, copper, nickel, an alloy such as an aluminum alloy or stainless steel, or the like. Since the metal substrate does not have a light-transmitting property with respect to visible light with a thickness in the above range although it has sufficiently low permeability and high flexibility, the light-emitting device in this embodiment is a so-called bottom emission light-emitting device in which light emission is extracted through the plastic substrate provided with a TFT layer. Note that the metal substrate is adhered to the light-emitting element with an adhesive layer interposed therebetween in a manner similar to the plastic substrate, and thus, a second adhesive layer is provided between a second electrode of the light-emitting element or a film sealing layer and the metal substrate. As a material of the second adhesive layer, a reactive curable adhesive, a thermal curable adhesive, an anaerobic adhesive, or the like can be used. Such an adhesive is made of an epoxy resin, an acrylic resin, a silicone resin, a phenol resin, or the like.

In the flexible light-emitting device in this embodiment with such a structure, over the high-permeability plastic substrate, the protective film with sufficiently low permeability which is formed at a temperature of greater than or equal to the upper temperature limit of the plastic substrate is provided, whereby the influence of moisture which enters through the plastic substrate can be effectively reduced. In addition, since the metal substrate having high flexibility and low permeability is used as a sealing substrate which faces the plastic substrate with the light-emitting element interposed therebetween, the influence of moisture which enters through the sealing substrate can also be effectively suppressed. In this manner, on both sides of the light-emitting element, it is possible to effectively reduce moisture which enters without stacking a plurality of films; therefore, the flexible light-emitting device in this embodiment is a flexible light-emitting device with long lifetime which can be easily manufactured.

A TFT, a light-emitting element, and the like may be formed in addition to the protective film in the layer to be separated which is formed over the formation substrate. As a TFT, a TFT which can be manufactured without a high-temperature process, such as a TFT using amorphous silicon or a TFT using an oxide semiconductor can be used. In addition, it is also possible to manufacture a TFT using a crystalline semiconductor layer which requires a certain degree of heating or laser processing, such as crystalline silicon, by forming a TFT over the formation substrate having high heat resistance. Accordingly, the flexible light-emitting device in this embodiment can be an active matrix flexible light-emitting device including a TFT which uses a crystalline semiconductor. In addition, since a TFT using a crystalline semiconductor can be used, a driver circuit portion or a CPU can be formed over the same substrate as that for a pixel portion. Thus, a flexible light-emitting device which has great advantages in cost and manufacturing process can be manufactured, differing from the case where a driver circuit portion or a CPU is provided separately.

Figure 1B:
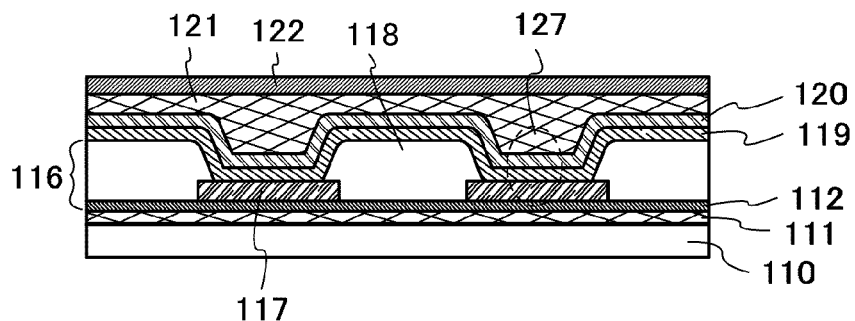
Figure 1C:
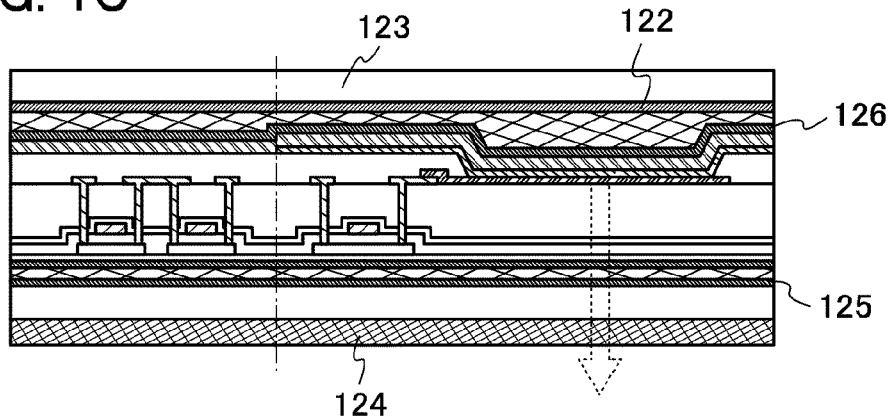

FIGS. 1A to 1C each illustrate a light-emitting device of this embodiment.

FIG. 1A illustrates an example of a flexible light-emitting device provided with a driver circuit portion and a pixel TFT. Over a plastic substrate 110, a first adhesive layer 111 is provided. With the first adhesive layer 111, a protective film 112 and the plastic substrate 110 are adhered to each other. Over the protective film 112, a base insulating film 113, a pixel TFT 114, a TFT 115 for the driver circuit portion, a first electrode 117 of a light-emitting element which is electrically connected to the pixel TFT 114, and a partition wall 118 which covers an end portion of the first electrode 117, which are partially illustrated in FIG. 1A, are provided. A light-emitting element 127 includes the first electrode 117 which is exposed from the partition wall 118, an EL layer 119 which is formed so as to cover at least the exposed first electrode 117 and contains an organic compound, and a second electrode 120 which is provided to cover the EL layer 119. A metal substrate 122 is adhered to the second electrode 120 with a second adhesive layer 121. Note that the driver circuit portion is not necessarily provided, and a CPU portion may be provided. In addition, in FIG. 1A, a layer 116 to be separated includes at least the protective film 112, the base insulating film 113, the pixel TFT 114, the TFT 115 for the driver circuit portion, a first interlayer insulating film 128, a second interlayer insulating film 129, the first electrode 117, and the partition wall 118, but this is just an example which can be easily manufactured and the components included in the layer 116 to be separated are not limited thereto.

FIG. 1B illustrates an example of a passive matrix flexible light-emitting device. As in FIG. 1A, a first adhesive layer 111 is provided over a plastic substrate 110. With the first adhesive layer 111, a layer 116 to be separated and the plastic substrate 110 are adhered to each other. The layer 116 to be separated includes a protective film 112, a first electrode 117 of a light-emitting element, and a partition wall 118, which are partially illustrated in FIG. 1B. A light-emitting element 127 includes the first electrode 117 which is exposed from the partition wall 118, an EL layer 119 which is formed so as to cover at least the exposed first electrode 117 and contains an organic compound, and a second electrode 120 which is provided in a stripe shape to cover the EL layer 119. A metal substrate 122 is adhered to the second electrode 120 with a second adhesive layer 121. In FIG. 1B, the layer 116 to be separated includes at least the protective film 112, the first electrode 117, and the partition wall 118, but this is just an example which can be easily manufactured and the components included in the layer 116 to be separated are not limited thereto. Although FIG. 1B illustrates an example of the passive matrix light-emitting device in which the partition wall 118 has a tapered shape, a passive matrix light-emitting device in which the partition wall 118 has an inversely tapered shape may also be used. In such a case, the EL layer 119 and the second electrode 120 can be separately provided due to the inversely tapered partition wall 118, so that patterning using a mask is not necessary in formation of the EL layer 119 and the second electrode 120.

Note that as illustrated in FIG. 1C, a resin layer 123 may be further provided over the metal substrate 122 to protect the metal substrate 122. Alternatively, a coat film 124 may be provided on the surface of the plastic substrate 110, which is opposite to the surface in contact with the first adhesive layer 111, so as to protect the surface of the plastic substrate from pressure or scratches. Further alternatively, a substrate which is provided with a protective film 125 with low permeability in advance may be used as the plastic substrate 110, or a structure in which moisture that enters the light-emitting device is further suppressed by providing a film sealing layer 126 over the second electrode 120 may be employed. The resin layer 123 can be formed using one or more of thermal curable resin materials such as an epoxy resin, an acrylic resin, a silicone resin, a phenol resin, and a polyester resin, or one or more of thermoplastic resin materials such as polypropylene, polyethylene, polycarbonate, polystyrene, polyamide, polyetherketone, a fluorine resin, and polyethylenenaphthalate. Further, the coat film 124 can be formed with various types of materials such as an organic film, an inorganic film, or a stack film including the organic film and the inorganic film, and means a hard coat film (such as a silicon nitride film) which can protect the surface of the soft plastic substrate 110 from scratches or the like, or a film (such as an aramid resin film) which can disperse pressure. The coat film 124 is preferably a film having a light-transmitting property with respect to visible light and high hardness. As the protective film 125 which is formed over the plastic substrate in advance or the film sealing layer 126, a film containing nitrogen and silicon, such as a silicon nitride film or a silicon nitride oxide film can be used, for example.

In the flexible light-emitting device in FIG. 1C, moisture that enters through the surfaces of the substrates is effectively suppressed by the protective film 112 and the metal substrate 122; thus, the protective film 125 or the film sealing layer 126 is effective because permeability is further supplementarily reduced. Note that as for the above four components, that is, the resin layer 123, the coat film 124, the protective film 125, and the film sealing layer 126, any one of them, two or more of them, or all of them may be employed. Although the structure of FIG. 1C is manufactured based on the structure of FIG. 1A, these components may also be combined with the structure of FIG. 1B.

In FIGS. 1A to 1C, only one light-emitting element 127 is illustrated; however, in the case where the flexible light-emitting device in this embodiment is used for displaying an image, a pixel portion including a plurality of the light-emitting elements 127 is formed. When a full-color image is displayed, it is necessary to obtain light of at least three colors, i.e., red, green, and blue. As a method for obtaining light of at least three colors, there are a method in which a necessary portion of each EL layer 119 is formed using an appropriate material in accordance with the color of light emission, a method in which each color is obtained by forming all light-emitting elements for emitting light of white and transmitting the light through a color filter layer, a method in which each color is obtained by forming all light-emitting elements for emitting light of blue or other colors with a shorter wavelength than blue and transmitting the light through a color conversion layer, and the like.

FIGS. 2A to 2D each illustrate how a color filter layer or a color conversion layer is placed. In FIGS. 2A to 2D, reference numeral 300 denotes a color filter layer (or a color conversion layer), and reference numeral 301 denotes a barrier film. The barrier film 301 is placed so as to protect a light-emitting element or a TFT from influence of a gas generated from the color filter layer (or the color conversion layer) 300, but is not necessarily provided. The color filter layer (or the color conversion layer) 300 is provided for a light-emitting element 127 of each color. And the adjacent color filter layers may be overlapped at a portion other than an open region (a portion where the first electrode, the EL layer, and the second electrode are directly overlapped) of the light-emitting element 127. The color filter layer 300 and the barrier film 301 may be formed only in the pixel portion or may be formed also in the driver circuit portion.

Figure 2A:
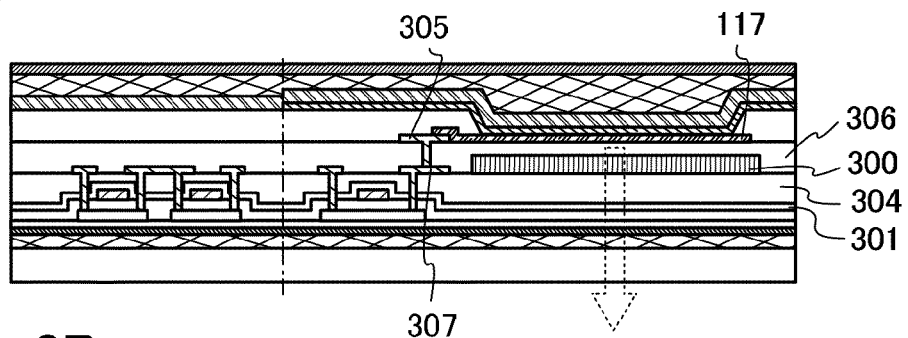
FIGS. 2A to 2D each illustrate a light-emitting device according to an embodiment.

In FIG. 2A, after an electrode 307 of a TFT is formed, the color filter layer 300 is formed over an interlayer insulating film 304 of the TFT, and a planarization film 306 is formed using an organic insulating film so as to planarize a step by the color filter layer. After that, a contact hole is formed in the planarization film 306, an electrode 305 which connects the first electrode 117 of the light-emitting element and the electrode 307 of the TFT is formed, and the first electrode 117 of the light-emitting element is provided. The barrier film 301 may be provided over the planarization film 306.

Figure 2B:
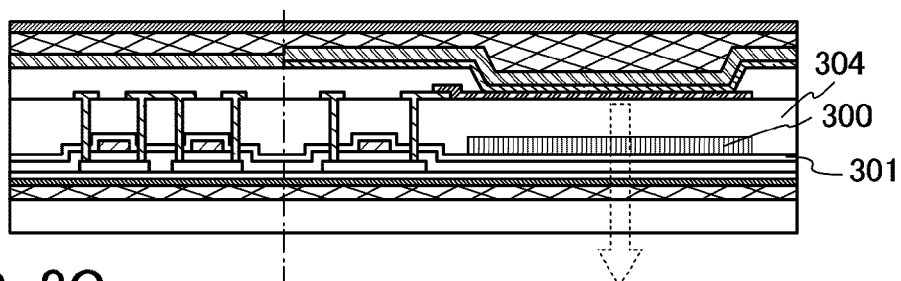

In addition, as illustrated in FIG. 2B, the color filter layer 300 may be provided below the interlayer insulating film 304. In FIG. 2B, after the barrier film 301 is formed, the color filter layer 300 is formed over the barrier film 301. After that, the interlayer insulating film 304 and the electrode 305 of the TFT are formed, and the first electrode 117 of the light-emitting element is provided.

Although FIGS. 2A to 2D each illustrate only a color filter layer (or a color conversion layer) of a single color, color filter layers (or color conversion layers) of red, green, and blue are formed at appropriate positions with appropriate shapes in a light-emitting device. Any arrangement can be adopted for the arrangement pattern of the color filter layers (or the color conversion layers), and stripe arrangement, diagonal mosaic arrangement, triangle mosaic arrangement, and the like may be used. In addition, in the case of using a white light-emitting element and a color filter layer, RGBW four pixel arrangement may be used. The RGBW four pixel arrangement is pixel arrangement which has a pixel provided with a color filter layer transmitting light of red, a pixel provided with a color filter layer transmitting light of blue, a pixel provided with a color filter layer transmitting light of green, and a pixel not provided with a color filter layer; this arrangement is effective in reducing power consumption and the like. Light emitted from the white light-emitting element includes, for example, light of red, light of green, and light of blue, preferably, those according to the National Television Standard Committee (NTSC).

The color filter layer can be formed by using a known material. In the case of using a photosensitive resin as the color filter layer, the color filter layer may be patterned by exposing the color filter layer itself to light and then developing it, but it is preferred to perform patterning by dry etching since a minute pattern is necessary.

Figure 2C:
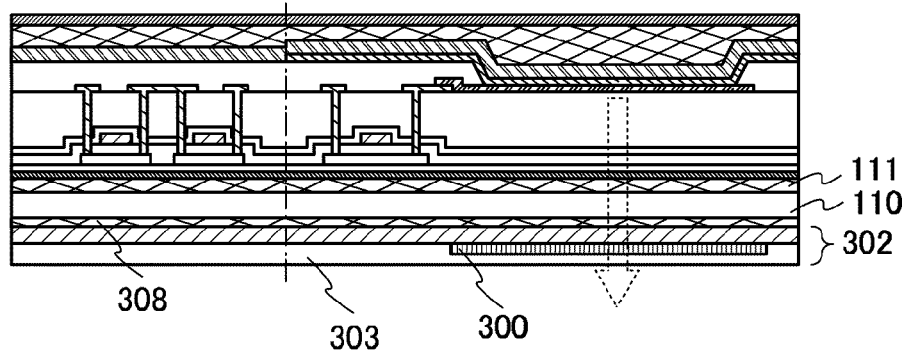

FIG. 2C illustrates an example of a structure in which a color filter substrate 302 provided with the color filter layer 300 is provided. In the case where the surface of the color filter substrate 302, which is not provided with the color filter layer 300, is attached to the plastic substrate 110 with an adhesive layer 308 which is formed with the same material as the first adhesive layer 111, the color filter substrate 302 may be provided with a coat film 303 for protecting the color filter layer 300 from scratches and the like. The coat film 303 is formed with a material having a light-transmitting property with respect to visible light, and the same material as that for the coat film 124 can be used. In addition, although not illustrated, the surface of the color filter substrate 302, which is provided with the color filter layer 300, may be attached to the plastic substrate 110. Note that the color filter substrate 302 is a substrate obtained by forming the color filter layer 300 on any of various types of substrates having flexibility and a light-transmitting property with respect to visible light, for example, a substrate formed using a material similar to that for the plastic substrate 110.

Figure 2D:
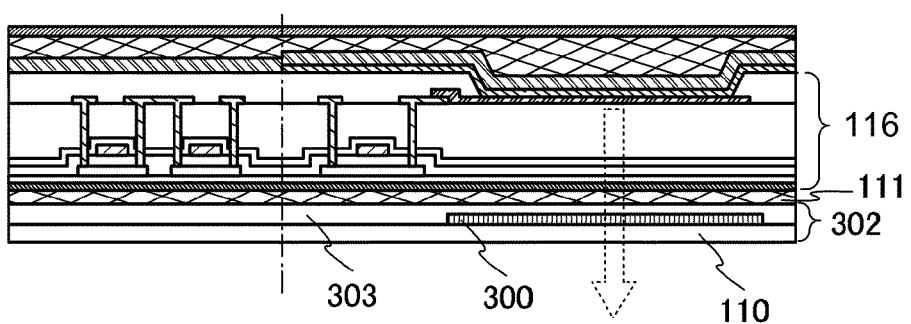

FIG. 2D illustrates an example of a structure in which the color filter substrate 302 obtained by providing, in advance, the color filter layer 300 for the plastic substrate 110 is directly attached to the layer 116 to be separated which has the first electrode. The color filter substrate 302 including the plastic substrate 110 provided with the color filter layer 300 is directly attached to the layer 116 to be separated which includes the first electrode, whereby the number of components can be reduced and the manufacturing cost can be reduced. The color filter layer (or the color conversion layer) is provided, as briefly described above. In addition to the above, a black matrix may be provided between light-emitting elements, or other known structures may be employed.

Next, as an example, a method for manufacturing a flexible light-emitting device in this embodiment including a TFT will be described with reference to FIGS. 3A to 3E and FIGS. 1A to 1C.

First, the layer 116 to be separated including the TFT, the first electrode 117, and the like is formed over a formation substrate 200 having an insulating surface, with a separation layer 201 interposed therebetween (FIG. 3A).

As the formation substrate 200, a glass substrate, a quartz substrate, a sapphire substrate, a ceramic substrate, a metal substrate provided with an insulating layer on the surface, or the like, which is a substrate having heat resistance that is high enough to form a high-quality protective film can be used.

Since a substrate with low flexibility which can be used for manufacture normal displays is used for the formation substrate, a pixel TFT for high-resolution display can be provided.

The separation layer 201 is formed by a sputtering method, a plasma CVD method, a coating method, a printing method, or the like to be a single layer or a stacked layer using an element such as tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), or silicon (Si); an alloy material containing the element as its main component; or a compound material containing the element as its main component. The crystalline structure of a layer containing silicon may be any one of an amorphous state, a microcrystalline state, and a polycrystalline state. Note that a coating method includes a spin-coating method, a droplet discharge method, a dispensing method, a nozzle-printing method, and a slot die coating method in its category here.

When the separation layer 201 has a single layer structure, it is preferable to form a tungsten layer, a molybdenum layer, or a layer containing a mixture of tungsten and molybdenum. Alternatively, a layer containing an oxide or an oxynitride of tungsten, a layer containing an oxide or an oxynitride of molybdenum, or a layer containing an oxide or an oxynitride of a mixture of tungsten and molybdenum is formed. Note that the mixture of tungsten and molybdenum corresponds to an alloy of tungsten and molybdenum, for example.

In the case where the separation layer 201 has a stacked layer structure, a first layer is preferably formed using a tungsten layer, a molybdenum layer, or a layer containing a mixture of tungsten and molybdenum, and a second layer is preferably formed using an oxide, a nitride, an oxynitride, or a nitride oxide of tungsten, molybdenum, or a mixture of tungsten and molybdenum.

In the case where the separation layer 201 has a stacked layer structure of a layer containing tungsten and a layer containing an oxide of tungsten, the layer containing tungsten may be formed first and an insulating layer formed of an oxide may be formed over the layer containing tungsten so that the layer containing an oxide of tungsten can be formed at an interface between the tungsten layer and the insulating layer. This also applies to the case of forming a layer containing a nitride, an oxynitride, or a nitride oxide of tungsten. For example, after a layer containing tungsten is formed, a silicon nitride layer, a silicon oxynitride layer, or a silicon nitride oxide layer may be formed thereover. Further, the surface of the layer containing tungsten may be subjected to thermal oxidation treatment, oxygen plasma treatment, or treatment using a strong oxidizing solution such as ozone water to form the layer containing an oxide of tungsten. Furthermore, plasma treatment or heat treatment may be performed in an atmosphere of oxygen, nitrogen, dinitrogen monoxide, an elementary substance of dinitrogen monoxide, or a mixed gas of any of these gases and another gas.

The layer 116 to be separated is formed over the separation layer 201. In order to form the layer 116 to be separated, first, the protective film 112 is formed over the separation layer 201. The protective film 112 can be a film which is dense and has very low permeability by forming an insulating film containing nitrogen and silicon such as a silicon nitride film, a silicon oxynitride film, or a silicon nitride oxide film by plasma CVD at a temperature in the range of 250° C. to 400° C. while setting other conditions to be known conditions.

Then, the base insulating film 113 is formed in order to stabilize the characteristics of the TFT which is to be formed later. The base insulating film 113 can be formed as a single layer or a stacked layer by using an inorganic insulating film of silicon oxide, silicon nitride, silicon oxynitride, silicon nitride oxide, or the like. When the protective film 112 also serves as an insulating film which is a base, the base insulating film 113 is not necessarily formed.

A semiconductor layer included in the transistor can be formed using any of the following materials: an amorphous semiconductor (hereinafter also referred to as "AS") manufactured by a vapor-phase growth method using a semiconductor source gas typified by silane or germane or a sputtering method; a polycrystalline semiconductor formed by crystallizing the amorphous semiconductor with the use of light energy or thermal energy; a microcrystalline (also referred to as semi-amorphous or microcrystal) semiconductor (hereinafter also referred to as "SAS"); a semiconductor containing an organic material as its main component; and the like. The semiconductor layer can be formed by a sputtering method, an LPCVD method, a plasma CVD method, or the like.

The microcrystalline semiconductor layer belongs to an intermediate metastable state between an amorphous semiconductor and a single crystal semiconductor when Gibbs free energy is considered. That is, the microcrystalline semiconductor layer is a semiconductor layer having a third state which is stable in terms of free energy and has a short range order and lattice distortion. Columnar-like or needle-like crystals grow in a normal direction with respect to a substrate surface. The Raman spectrum of microcrystalline silicon, which is a typical example of a microcrystalline semiconductor, is shifted to a wave number lower than 520 cm$^{-1}$, which represents a peak of the Raman spectrum of single crystal silicon. That is, the peak of the Raman spectrum of the microcrystalline silicon exists between 520 cm$^{-1}$ which represents single crystal silicon and 480 cm$^{-1}$ which represents amorphous silicon. The microcrystalline silicon contains hydrogen or halogen of at least 1 at. % to terminate a dangling bond. Moreover, microcrystalline silicon is made to contain a rare gas element such as helium, argon, krypton, or neon to further enhance its lattice distortion, whereby stability is increased and a favorable microcrystalline semiconductor layer can be obtained.

This microcrystalline semiconductor layer can be formed by a high-frequency plasma CVD method with a frequency of several tens of MHz to several hundreds of MHz or with a microwave plasma CVD method with a frequency of greater than or equal to 1 GHz. For example, the microcrystalline semiconductor layer can be formed with a dilution of silicon hydride such as $SiH_4$, $Si_2H_6$, $SiH_2Cl_2$, $SiHCl_3$, $SiCl_4$, or $SiF_4$ with hydrogen. Further, in addition to silicon hydride and hydrogen, one or plural kinds of rare gas elements selected from helium, argon, krypton, or neon are used for a dilution, so that the microcrystalline semiconductor layer can be formed. In that case, the flow ratio of hydrogen to silicon hydride is set to be 5:1 to 200:1, preferably, 50:1 to 150:1, more preferably, 100:1.

As an example of an amorphous semiconductor, hydrogenated amorphous silicon can be given, and as an example of a crystalline semiconductor, polysilicon or the like can be given. Examples of polysilicon (polycrystalline silicon) include so-called high-temperature polysilicon that contains polysilicon which is formed at a process temperature of greater than or equal to 800° C. as its main component, so-called low-temperature polysilicon that contains polysilicon which is formed at a process temperature of less than or equal to 600° C. as its main component, polysilicon obtained by crystallizing amorphous silicon by using an element that promotes crystallization or the like, and the like. It is needless to say that as mentioned above, a microcrystalline semiconductor or a semiconductor containing a crystal phase in a part of a semiconductor layer can be used.

As a material of the semiconductor layer, as well as an element such as silicon (Si) or germanium (Ge), a compound semiconductor such as GaAs, InP, SiC, ZnSe, GaN, or SiGe can be used. Alternatively, an oxide semiconductor such as zinc oxide (ZnO), tin oxide ($SnO_2$), magnesium zinc oxide, gallium oxide, or indium oxide, an oxide semiconductor including two or more of the above oxide semiconductors, or the like can be used. For example, an oxide semiconductor including zinc oxide, indium oxide, and gallium oxide can also be used. In the case of using zinc oxide for the semiconductor layer, the gate insulating film may be formed of $Y_2O_3$, $Al_2O_3$, or $TiO_2$, a stacked layer thereof, or the like, and the gate electrode layer, the source electrode layer, and the drain electrode layer may be formed of indium tin oxide (ITO), Au, Ti, or the like. In addition, In, Ga, or the like can be added to ZnO. Note that a transparent transistor using an oxide semiconductor film which transmits visible light as a semiconductor layer can also be used as a transistor in a pixel portion. When such a transparent transistor is formed so as to overlap with a light-emitting element, an area ratio of a light-emitting element in a pixel, that is, a so-called aperture ratio can be increased, and a flexible display device with high luminance and high resolution can be formed. Further, when a gate electrode, a source electrode, and a drain electrode of a transparent transistor are formed using a conductive film which transmits visible light, an aperture ratio can be further increased.

In the case of using a crystalline semiconductor layer for the semiconductor layer, the crystalline semiconductor layer may be formed by any of various methods (such as a laser crystallization method, a thermal crystallization method, and a thermal crystallization method using an element promoting crystallization, such as nickel). Also, a microcrystalline semiconductor which is an SAS can be crystallized by being irradiated with laser light to increase its crystallinity. When the element that promotes crystallization is not introduced, prior to irradiating an amorphous silicon film with laser light, the amorphous silicon film is heated at 500° C. for one hour under a nitrogen atmosphere to release hydrogen contained in the amorphous silicon film such that the concentration of hydrogen becomes less than or equal to $1\times10^{20}$ atoms:$Dcm^3$. This is because the amorphous silicon film is destroyed when the amorphous silicon film containing a high amount of hydrogen is irradiated with laser light.

A method for introducing a metal element into an amorphous semiconductor layer is not limited to a particular method as long as it is a method capable of providing the metal element on a surface or inside of the amorphous semiconductor layer. For example, a sputtering method, a CVD method, a plasma processing method (including a plasma CVD method), an adsorption method, or a method for applying a solution of metal salt, can be used. In the above mentioned methods, the method using a solution is simple and has an advantage that the concentration of a metal element can easily be adjusted. In addition, at this time, in order to improve the wettability of the surface of the amorphous semiconductor layer to spread an aqueous solution on the entire surface of the amorphous semiconductor layer, an oxide film is preferably formed by UV light irradiation in an oxygen atmosphere, a thermal oxidation method, treatment using ozone water containing hydroxy radical or a hydrogen peroxide solution, or the like.

In addition, in a crystallization step in which the amorphous semiconductor layer is crystallized to form a crystalline semiconductor layer, the crystallization may be performed by adding an element which promotes crystallization (also referred to as a catalyst element or a metal element) to the amorphous semiconductor layer and performing heat treatment (at 550° C. to 750° C. for 3 minutes to 24 hours). As the element which promotes (accelerates) the crystallization, one or more of iron (Fe), nickel (Ni), cobalt (Co), ruthenium (Ru), rhodium (Rh), palladium (Pd), osmium (Os), iridium (Ir), platinum (Pt), copper (Cu), and gold (Au) can be used.

In order to remove or reduce the element which promotes crystallization from the crystalline semiconductor layer, a semiconductor layer containing an impurity element is formed in contact with the crystalline semiconductor layer and is made to function as a gettering sink. As the impurity element, an impurity element imparting n-type conductivity, an impurity element imparting p-type conductivity, a rare gas element, or the like can be used. For example, one or more of phosphorus (P), nitrogen (N), arsenic (As), antimony (Sb), bismuth (Bi), boron (B), helium (He), neon (Ne), argon (Ar), krypton (Kr), and xenon (Xe) can be used. The semiconductor layer containing a rare gas element is formed over the crystalline semiconductor layer containing an element which promotes crystallization, and heat treatment (at 550° C. to 750° C. for 3 minutes to 24 hours) is performed. The element which promotes crystallization in the crystalline semiconductor layer moves into the semiconductor layer containing a rare gas element, and the element which promotes crystallization in the crystalline semiconductor layer is removed or reduced. Then, the semiconductor layer containing a rare gas element, which serves as a gettering sink, is removed.

The amorphous semiconductor layer may be crystallized by using combination of heat treatment and laser light irradiation. The heat treatment or the laser light irradiation may be carried out several times, separately.

Alternatively, the crystalline semiconductor layer may be directly formed over the base insulating film over the formation substrate by a plasma method. Alternatively, the crystalline semiconductor layer may be selectively formed over the base insulating film over the formation substrate by a plasma method.

As the semiconductor layer containing an organic material as its main component, a semiconductor layer containing, as its main component, a substance which contains a certain amount of carbon or an allotrope of carbon (excluding diamond), which is combined with another element, can be used. Specifically, pentacene, tetracene, a thiophen oligomer derivative, a phenylene derivative, a phthalocyanine compound, a polyacetylene derivative, a polythiophene derivative, a cyanine dye, and the like can be given.

The gate insulating film and the gate electrode may be formed with a known structure and a known method. For example, the gate insulating film may be formed with a known structure such as a single layer structure of silicon oxide or a stacked layer structure including silicon oxide and silicon nitride, and the gate electrode may be formed using any of Ag, Au, Cu, Ni, Pt, Pd, Ir, Rh, W, Al, Ta, Mo, Cd, Zn, Fe, Ti, Si, Ge, Zr, and Ba; or an alloy material or a compound material containing any of the elements as its main component by a CVD method, a sputtering method, a droplet discharge method, or the like. In addition, a semiconductor layer typified by a polycrystalline silicon film doped with an impurity element such as phosphorus or an AgPdCu alloy may be used. Further, either a single layer structure or a stacked layer structure may be employed.

Note that although FIGS. 1A to 1C each illustrate an example of a top gate transistor, a bottom gate transistor or a transistor with other known structures may also be used.

Next, an interlayer insulating film is formed. The interlayer insulating film can be formed using an inorganic insulating material or an organic insulating material to have a single layer structure or a stacked layer structure. As the organic insulating material, for example, acrylic, polyimide, polyamide, polyimide amide, benzocyclobutene, or the like can be used. Although two interlayer insulating films 128 and 129 are illustrated in FIGS. 1A and 1C, this is just an example, and the structure of the interlayer insulating film is not limited thereto.

The interlayer insulating film which is formed is patterned and etched, and a contact hole which reaches the semiconductor layer of the transistor is formed in the interlayer insulating film, the gate insulating film, and the like. Then, a conductive metal film is deposited by a sputtering method or a vacuum evaporation method and etched to form an electrode and a wiring of the transistor. A drain electrode of the pixel transistor is formed so as to partially overlap with a first electrode which is a pixel electrode, whereby the drain electrode of the pixel transistor and the first electrode are electrically connected to each other.

Then, the first electrode 117 is formed using a conductive film having a light-transmitting property with respect to visible light. When the first electrode 117 is an anode, indium oxide ($In_2O_3$), an alloy of indium oxide and tin oxide ($In_2O_3$—$SnO_2$:ITO), or the like can be used as a material of the conductive film having a light-transmitting property with respect to visible light, and the first electrode 117 can be formed by a sputtering method, a vacuum evaporation method, or the like. Alternatively, an alloy of indium oxide and zinc oxide ($In_2O_3$—$ZnO$) may be used. In addition, zinc oxide (ZnO) is also an appropriate material, and moreover, zinc oxide to which gallium (Ga) is added (ZnO:Ga) to increase conductivity and a light-transmitting property with respect to visible light, or the like can be used. When the first electrode 117 is a cathode, an extremely thin film of a material with a low work function such as aluminum can be used. Alternatively, a stacked layer structure which has a thin layer of such a substance and the above-mentioned conductive film having a light-transmitting property with respect to visible light can be employed.

Then, an insulating film is formed using an organic insulating material or an inorganic insulating material so as to cover the interlayer insulating film and the first electrode 117. The insulating film is processed such that the surface of the first electrode 117 is exposed and the insulating film covers an end portion of the first electrode 117, whereby the partition wall 118 is formed.

Through the above process, the layer 116 to be separated can be formed.

Next, the layer 116 to be separated and a temporary supporting substrate 202 are adhered to each other using an adhesive 203 for separation, which is followed by separation of the layer 116 to be separated from the formation substrate 200 at the separation layer 201. By this process, the layer 116 to be separated is placed on the temporary supporting substrate 202 side (FIG. 3B).

As the temporary supporting substrate 202, a glass substrate, a quartz substrate, a sapphire substrate, a ceramic substrate, a metal substrate, and the like can be used. Further, a plastic substrate which has heat resistance high enough to resist a temperature of the manufacturing process of this embodiment, or a flexible substrate such as a film may be used.

As the adhesive 203 for separation which is used here, an adhesive which is soluble in water or a solvent, an adhesive which is capable of being plasticized upon irradiation of UV light, and the like are used so that the temporary supporting substrate 202 and the layer 116 to be separated can be chemically or physically separated when necessary.

Any of various methods can be used as appropriate as the process for transferring the layer to be separated to the temporary supporting substrate. When, as the separation layer, a film including a metal oxide film is formed on the side in contact with the layer to be separated, the metal oxide film is embrittled by being crystallized, and thus the layer to be separated can be separated from the formation substrate. When an amorphous silicon film containing hydrogen is formed as the separation layer between the formation substrate having high heat resistance and the layer to be separated, by removing the amorphous silicon film by laser light irradiation or etching, the layer to be separated can be separated from the formation substrate. In addition, after a film including a metal oxide film is formed as the separation layer on the side in contact with the layer to be separated, the metal oxide film is embrittled by being crystallized, and a part of the separation layer is removed by etching using a solution or a halogen fluoride gas such as $NF_3$, $BrF_3$, or $ClF_3$, the separation can be performed at the embrittled metal oxide film. Furthermore, a method may be used in which a film containing nitrogen, oxygen, hydrogen, or the like (for example, an amorphous silicon film containing hydrogen, an alloy film containing hydrogen, an alloy film containing oxygen, or the like) is used as the separation layer, and the separation layer is irradiated with laser light to release the nitrogen, oxygen, or hydrogen contained in the separation layer as a gas, thereby promoting separation between the layer to be separated and the formation substrate.

Furthermore, a method in which the formation substrate over which the layer to be separated is formed is removed mechanically or by etching using a solution or a halogen fluoride gas such as $NF_3$, $BrF_3$, or $ClF_3$, or the like may be used. In this case, the separation layer is not necessarily provided.

When a plurality of the above-described separation methods are combined, the transfer process can be conducted easily. For example, separation can be performed with physical force (by a machine or the like) after performing laser light irradiation, etching on the separation layer with a gas, a solution, or the like, or mechanical removal with a sharp knife, scalpel, or the like so that the separation layer and the layer to be separated can be easily separated from each other.

Alternatively, separation of the layer to be separated from the formation substrate may be carried out after a liquid is made to penetrate an interface between the separation layer and the layer to be separated. Further alternatively, the separation may be performed while pouring a liquid such as water during the separation.

As another separation method, when the separation layer 201 is formed using tungsten, the separation may be performed while the separation layer 201 is etched with the use of a mixed solution of ammonia water and a hydrogen peroxide solution.

Next, the layer 116 to be separated which is separated from the formation substrate 200 to expose the separation layer 201 or the protective film 112 is adhered to the plastic substrate 110 using the first adhesive layer 111 which is formed of a different adhesive from the adhesive 203 for separation (FIG. 3C).

As a material of the first adhesive layer 111, various curable adhesives, e.g., a light curable adhesive such as a UV curable adhesive, a reactive curable adhesive, a thermal curable adhesive, and an anaerobic adhesive can be used.

As the plastic substrate 110, any of a variety of substrates having flexibility and a light-transmitting property with respect to visible light can be used, and a film of an organic resin or the like is preferably used. As the organic resin, for example, a polyester resin such as polyethylene terephthalate (PET) or polyethylene naphthalate (PEN), an acrylic resin, a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinylchloride resin, or the like can be used.

Over the plastic substrate 110, the protective film 125 having low permeability, such as a film containing nitrogen and silicon, e.g., silicon nitride or silicon oxynitride, a film containing nitrogen and aluminum such as aluminum nitride, or an aluminum oxide film may be formed in advance.

After that, the temporary supporting substrate 202 is removed by dissolving or plasticizing the adhesive 203 for separation. After the temporary supporting substrate 202 is removed, the adhesive 203 for separation is removed using water, a solvent, or the like to allow the first electrode 117 of the light-emitting element to be exposed (FIG. 3D).

Through the above-mentioned process, the layer 116 to be separated, which includes components such as the TFT and the first electrode 117 of the light-emitting element, can be manufactured over the plastic substrate 110.

After the first electrode 117 is exposed, the EL layer 119 is formed. There is no particular limitation on a stacked layer structure of the EL layer 119. A layer containing a substance having a high electron-transporting property, a layer containing a substance having a high hole-transporting property, a layer containing a substance having a high electron-injecting property, a layer containing a substance having a high hole-injecting property, a layer containing a bipolar substance (a substrate having a high electron-transporting property and a high hole-transporting property), and the like are appropriately combined. For example, an appropriate combination of any of a hole-injecting layer, a hole-transporting layer, a light-emitting layer, an electron-transporting layer, an electron-injecting layer, and the like can be formed. In this embodiment, a structure is explained in which the EL layer includes a hole-injecting layer, a hole-transporting layer, a light-emitting layer, and an electron-transporting layer. Specific materials to form each of the layers are given below.

The hole-injecting layer is a layer that is provided in contact with an anode and contains a substance with a high hole-injecting property. Specifically, molybdenum oxide, vanadium oxide, ruthenium oxide, tungsten oxide, manganese oxide, or the like can be used. Alternatively, the hole-injecting layer can also be formed using any of the following materials: a phthalocyanine compound such as phthalocyanine ($H_2PC$) or copper phthalocyanine (CuPc); an aromatic amine compound such as 4,4'-bis[N-(4-diphenylaminophenyl)-N-phenylamino]biphenyl (DPAB) or 4,4'-bis(N-{4-[N-(3-methylphenyl)-N-phenylamino]phenyl}-N-phenylamino)biphenyl (DNTPD); a high-molecular compound such as polyethylenedioxythiophene:Dpolystyrenesulfonic acid (PEDOT:DPSS); and the like.

Alternatively, as the hole-injecting layer, a composite material containing a substance with a high hole-transporting property and an acceptor substance can be used. Note that, by using the composite material containing the substance with a high hole-transporting property and the acceptor substance, a material used to form an electrode can be selected regardless of its work function. In other words, besides a material with a high work function, a material with a low work function can also be used as the first electrode 117. As the acceptor substance, 7,7,8,8-tetracyano-2,3,5,6-tetrafluoroquinodimethane ($F_4$-TCNQ), chloranil, and the like can be given. In addition, a transition metal oxide is given. In addition, oxides of metals that belong to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable because of their high electron-accepting properties. Among these metal oxides, molybdenum oxide is preferable since it can be easily treated due to its stability in the air and low hygroscopic property.

As the substance having a high hole-transporting property used for the composite material, any of various compounds such as an aromatic amine compound, a carbazole derivative, aromatic hydrocarbon, and a high-molecular compound (such as oligomer, dendrimer, or polymer) can be used. Note that the organic compound used for the composite material is preferably an organic compound having a high hole-transporting property. Specifically, a substance having a hole mobility of greater than or equal to $10^{-6}$ $cm^2$:DVs is preferably used. However, other substances than these substances may also be used as long as a hole-transporting property thereof is higher than an electron-transporting property thereof. The organic compound that can be used for the composite material is specifically shown below.

Examples of the aromatic amine compounds include N,N'-di(p-tolyl)-N,N'-diphenyl-p-phenylenediamine (DTDPPA), 4,4'-bis[N-(4-diphenylaminophenyl)-N-phenylamino]biphenyl (DPAB), 4,4'-bis(N-{4-[N-(3-methylphenyl)-N-phenylamino]phenyl}-N-phenylamino)biphenyl (DNTPD), 1,3,5-tris[N-(4-diphenylaminophenyl)-N-phenylamino]benzene (DPA3B), and the like.

Examples of the carbazole derivatives which can be used for the composite material include 3-[N-(9-phenylcarbazol-3-yl)-N-phenylamino]-9-phenylcarbazole (PCzPCA1), 3,6-bis[N-(9-phenylcarbazol-3-yl)-N-phenylamino]-9-phenylcarbazole (PCzPCA2), 3-[N-(1-naphtyl)-N-(9-phenylcarbazol-3-yl)amino]-9-phenylcarbazole (PCzPCN1), and the like.

In addition, examples of the carbazole derivatives which can be used for the composite material include 4,4'-di(N-carbazolyl)biphenyl (CBP), 1,3,5-tris[4-(N-carbazolyl)phenyl]benzene (TCPB), 9-[4-(10-phenyl-9-anthryl)phenyl]-9H-carbazole (CzPA), 1,4-bis[4-(N-carbazolyl)phenyl]-2,3,5,6-tetraphenylbenzene, and the like.

Examples of the aromatic hydrocarbon which can be used for the composite material include 2-tert-butyl-9,10-di(2-naphthyl)anthracene (t-BuDNA), 2-tert-butyl-9,10-di(1-naphthyl)anthracene, 9,10-bis(3,5-diphenylphenyl)anthracene (DPPA), 2-tert-butyl-9,10-bis(4-phenylphenyl)anthracene (t-BuDBA), 9,10-di(2-naphthyl)anthracene (DNA), 9,10-diphenylanthracene (DPAnth), 2-tert-butylanthracene (t-BuAnth), 9,10-bis(4-methyl-1-naphthyl)anthracene (DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthypanthracene, 2,3,6,7-tetramethyl-9,10-di(2-naphthypanthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. As well as these compounds, pentacene, coronene, or the like can be used. As described above, use of an aromatic hydrocarbon which has a hole mobility of greater than or equal to $1 \times 10^{-6}$ $cm^2$:DVs and has 14 to 42 carbon atoms is more preferable.

The aromatic hydrocarbon that can be used for the composite material may have a vinyl skeleton. As an aromatic hydrocarbon having a vinyl group, for example, 4,4'-bis(2,2-diphenylvinyl)biphenyl (DPVBi), 9,10-bis[4-(2,2-diphenylvinyl)phenyl]anthracene (DPVPA), and the like are given.

High-molecular compounds such as poly(N-vinylcarbazole) (PVK), poly(4-vinyltriphenylamine) (PVTPA), poly [N-(4-{N'-[4-(4-diphenylamino)phenyl]phenyl-N'-phenylamino}phenyl)methacrylamide] (PTPDMA), poly[N,N'-bis(4-butylphenyl)-N,N'-bis(phenyl)benzidine] (Poly-TPD), and the like can also be used.

The hole-transporting layer is a layer that contains a substance with a high hole-transporting property. Examples of the substance having a high hole-transporting property include aromatic amine compounds such as 4,4'-bis[N-(1-naphthyl)-N-phenylamino]biphenyl (NPB), N,N'-bis(3-methylphenyl)-N,N'-diphenyl-[1,1'-biphenyl]-4,4'-diamine (TPD), 4,4',4''-tris(N,N-diphenylamino)triphenylamine (TDATA), 4,4',4''-tris[N-(3-methylphenyl)-N-phenylamino]triphenylamine (MTDATA), 4,4'-bis[N-(spiro-9,9'-bifluoren-2-yl)-N-phenylamino]biphenyl (BSPB), and the like. The substances described here are mainly substances having a hole mobility of greater than or equal to $10^{-6}$ cm$^2$:DVs. However, a substance other than the above-described substances may also be used as long as a hole-transporting property thereof is higher than an electron-transporting property thereof. Note that the layer containing the substance with a high hole-transporting property is not limited to a single layer, and two or more layers containing the aforementioned substances may be stacked.

Further, a high-molecular compound such as poly(N-vinylcarbazole) (PVK) or poly(4-vinyltriphenylamine) (PVTPA) can also be used for the hole-transporting layer.

The light-emitting layer is a layer containing a light-emitting substance. The light-emitting layer may be a so-called single light-emitting layer containing a light-emitting substance as its main component or a so-called host-guest type light-emitting layer in which a light-emitting substance is dispersed in a host material.

There is no particular limitation on the light-emitting substance that is used, and known fluorescent materials or phosphorescent materials can be used. As fluorescent materials, for example, in addition to N,N-bis[4-(9H-carbazol-9-yl)phenyl]-N,N'-diphenylstilbene-4,4'-diamine (YGA2 S), 4-(9H-carbazol-9-yl)-4'-(10-phenyl-9-anthryl)triphenylamine (YGAPA), and the like, there are fluorescent materials with an emission wavelength of greater than or equal to 450 nm, such as 4-(9H-carbazol-9-yl)-4'-(9,10-diphenyl-2-anthryl)triphenylamine (2YGAPPA), N,9-diphenyl-N-[4-(10-phenyl-9-anthryl)phenyl]-9H-carbazol-3-amine (PCAPA), perylene, 2,5,8,11-tetra-tert-butylperylene (TBP), 4-(10-phenyl-9-anthryl)-4'-(9-phenyl-9H-carbazol-3-yl)triphenylamine (PCBAPA), N,N''-(2-tert-butylanthracene-9,10-diyldi-4,1-phenylene)bis[N,N',N'-triphenyl-1,4-phenylenediamine] (DPABPA), N,9-diphenyl-N-[4-(9,10-diphenyl-2-anthryl)phenyl]-9H-carbazol-3-amine (2P CAPPA) N-[4-(9,10-diphenyl-2-anthryl)phenyl]-N,N',N'-triphenyl-1,4-phenylenediamine (2DPAPPA), N,N,N',N',N'',N''',N'''-octaphenyldibenzo[g,p]chrysene-2,7,10,15-tetraamine (DBC1), coumarin 30, N-(9,10-diphenyl-2-anthryl)-N,9-diphenyl-9H-carbazol-3-amine (2PCAPA), N-[9,10-bis(1,1'-biphenyl-2-yl)-2-anthryl]-N,9-diphenyl-9H-carbazol-3-amine (2P CABPhA), N-(9,10-diphenyl-2-anthryl)-N,N'-triphenyl-1,4-phenylenediamine (2DPAPA), N-[9,10-bis(1,1'-biphenyl-2-yl)-2-anthryl]-N,N',N'-triphenyl-1,4-phenylenediamine (2DPABPhA), 9,10-bis(1,1'-biphenyl-2-yl)-N-[4-(9H-carbazol-9-yl)phenyl]-N-phenylanthracen-2-amine (2YGABPhA), N,N,9-triphenylanthracen-9-amine (DPhAPhA), coumarin 545T, N,N'-diphenylquinacridone (DPQd), rubrene, 5,12-bis(1,1'-biphenyl-4-yl)-6,11-diphenyltetracene (BPT), 2-(2-{2-[4-(dimethylamino)phenyl]ethenyl}-6-methyl-4H-pyran-4-ylidene)propanedinitrile (DCM1), 2-{2-methyl-6-[2-(2,3,6,7-tetrahydro-1H,5H-benzo[ij]quinolizin-9-yl)ethenyl]-4H-pyran-4-ylidene}propanedinitrile (DCM2), N,N,N',N'-tetrakis(4-methylphenyl)tetracene-5,11-diamine (p-mPhTD), 7,13-diphenyl-N,N,N',N'-tetrakis(4-methylphenypacenaphtho[1,2-a]fluoranthene-3,10-diamine (p-mPhAFD), 2-{2-isopropyl-6-[2-(1,1,7,7-tetramethyl-2,3,6,7-tetrahydro-1H,5H-benzo[ij]quinolizin-9-ypethenyl]-4H-pyran-4-ylidene}propane dinitrile (DCJTI), 2-{2-tert-butyl-6-[2-(1,1,7,7-tetramethyl-2,3,6,7-tetrahydro-1H,5H-benzo[ij]quinolizin-9-ypethenyl]-4H-pyran-4-ylidene}propane dinitrile (DCJTB), 2-(2,6-bis{2-[4-(dimethylamino)phenyl]ethenyl}-4H-pyran-4-ylidene)propanedinitrile (BisDCM), and 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (BisDCJTM). As phosphorescent materials, for example, in addition to bis[2-(4',6'-difluorophenyl)pyridinato-N,C$^{2'}$]iridium(III)tetrakis(1-pyrazolyl)borate (FIr6) and the like, there are phosphorescent materials with an emission wavelength in the range of 470 nm to 500 nm, such as bis[2-(4',6'-difluorophenyl)pyridinato-N, C$^{2'}$]iridium(III)picolinate (FIrpic), bis[2-(3',5'-bistrifluoromethylphenyl)pyridinato-N,C$^{2'}$]iridium(III)picolinate (Ir(CF$_3$ppy)$_2$(pic)), and bis[2-(4',6'-difluorophenyl)pyridinato-N,C$^{2'}$]iridium(III)acetylacetonate (FIracac); phosphorescent materials with an emission wavelength of greater than or equal to 500 nm (materials which emit green light), such as tris(2-phenylpyridinato)iridium(III) (Ir(ppy)$_3$), bis(2-phenylpyridinato)iridium(III)acetylacetonate (Ir(ppy)$_2$(acac)), tris(acetylacetonato)(monophenanthroline)terbium(III) (Tb(acac)$_3$(Phen)), bis(benzo[h]quinolinato)iridium(III)acetylacetonate (Ir(bzq)$_2$(acac)), bis(2,4-diphenyl-1,3-oxazolato-N,C$^{2'}$)iridium(III)acetylacetonate (Ir(dpo)$_2$(acac)), bis[2-(4'-perfluorophenylphenyl)pyridinato]iridium(III) acetylacetonate (Ir(p-PF-ph)$_2$(acac)), bis(2-phenylbenzothiazolato-N,C$^{2'}$)iridium(III)acetylacetonate (Ir(bt)$_2$(acac)), bis[2-(2'-benzo[4,5-α]thienyl)pyridinato-N,C$^{3'}$]iridium(III)acetylacetonate (Ir(btp)$_2$(acac)), bis(1-phenylisoquinolinato-N,C$^{2'}$)iridium(III)acetylacetonate (Ir(piq)$_2$(acac)), (acetylacetonato)bis[2,3-bis(4-fluorophenyl)quinoxalinato]iridium(III) (Ir(Fdpq)$_2$(acac)), (acetylacetonato)bis(2,3,5-triphenylpyrazinato)iridium(III) (Ir(tppr)$_2$(acac)), 2,3,7,8,12,13,17,18-octaethyl-21H,23H-porphyrinatoplatinum(II) (PtOEP), tris(1,3-diphenyl-1,3-propanedionato)(monophenanthroline)europium(III) (Eu(DBM)$_3$(Phen)), and tris[1-(2-thenoyl)-3,3,3-trifluoroacetonato](monophenanthroline)europium(III) (Eu(TTA)$_3$(Phen)); and the like. The light-emitting substances can be selected from the above-mentioned materials or other known materials in consideration of the emission color of each of the light-emitting elements.

When the host material is used, for example, the following can be given: metal complexes such as tris(8-quinolinolato)aluminum(III) (Alq), tris(4-methyl-8-quinolinolato)aluminum(III) (Almq$_3$), bis(10-hydroxybenzo[h]quinolinato)beryllium(II) (BeBq$_2$), bis(2-methyl-8-quinolinolato)(4-phenylphenolato)aluminum(III) (BAlq), bis(8-quinolinolato)zinc(II) (Znq), bis[2-(2-benzoxazolyl)phenolato]zinc(II) (ZnPBO), and bis[2-(2-benzothiazolyl)phenolato]zinc(II) (ZnBTZ); heterocyclic compounds such as 2-(4-biphenylyl)-5-(4-tert-butylphenyl)-1,3,4-oxadiazole (PBD), 1,3-bis[5-(p-tert-butylphenyl)-1,3,4-oxadiazol-2-yl]benzene (OXD-7), 3-(4-biphenylyl)-4-phenyl-5-(4-tert-butylphenyl)-1,2,4-triazole (TAZ), 2,2',2''-(1,3,5-benzenetriyl)-tris(1-phenyl-1H-benzimidazole) (TPBI), bathophenanthroline (BPhen), bathocuproine (BCP), and 9-[4-(5-phenyl-1,3,4-oxadiazol-2-yl)phenyl]-9H-carbazole (CO11); and aromatic amine compounds such as NPB (or α-NPD), TPD, and BSPB. In addition, condensed polycyclic aromatic compounds such as anthracene derivatives, phenanthrene derivatives, pyrene derivatives, chrysene derivatives, and dibenzo[g,p]chrysene derivatives are given. The following is specifically given as the condensed polycyclic aromatic compound: 9,10-diphenylanthracene (DPAnth); N,N-diphenyl-9-[4-(10-phenyl-9-anthryl)phenyl]-9H-carbazol-3-amine (CzAlPA); 4-(10-phenyl-9-anthryl)triphenylamine (DPhPA); 4-(9H-carbazol-9-yl)-4'-(10-phenyl-9-anthryl) triphenylamine (YGAPA); N,9-diphenyl-N-[4-(10-phenyl-9-anthryl)phenyl]-9H-carbazol-3-amine (PCAPA); N,9-diphenyl-N-{4-[4-(10-phenyl-9-anthryl)phenyl]phenyl}-9H-carbazol-3-amine (PCAPBA); N-9-diphenyl-N-(9,10-diphenyl-2-anthryl)-9H-carbazol-3-amine (2PCAPA); 6,12-dimethoxy-5,11-diphenylchrysene, N,N,N',N',N'',N'',N''',N'''-octaphenyldibenzo[g,p]chrysene-2,7,10,15-tetramine (DBC1); 9-[4-(10-phenyl-9-anthryl)phenyl]-9H-carbazole (CzPA); 3,6-diphenyl-9-[4-(10-phenyl-9-antryl)phenyl]-9H-carbazole (DPCzPA), 9,10-bis(3,5-diphenylphenyl)anthracene (DPPA), 9,10-di(2-naphthyl)anthracene (DNA), 2-tert-butyl-9,10-di(2-naphthyl)anthracene (t-BuDNA), 9,9'-bianthryl (BANT), 9,9'-(stilbene-3,3'-diyl)diphenanthrene (DPNS), 9,9'-(stilbene-4,4'-diyl)diphenanthrene (DPNS2), 3,3',3''-(benzene-1,3,5-triyl)tripyrene (TPB3), and the like. From these substances or other known substances, the host material may be selected so that the host material has a larger energy gap (or triplet excitation energy if the light-emitting substance emits phosphorescence) than the light-emitting substance dispersed in the light-emitting layer and has a carrier-transporting property required for each of the light-emitting layers.

The electron-transporting layer is a layer that contains a substance with a high electron-transporting property. For example, a layer containing a metal complex having a quinoline skeleton or a benzoquinoline skeleton, such as tris(8-quinolinolato)aluminum (Alq), tris(4-methyl-8-quinolinolato)aluminum (Almq$_3$), bis(10-hydroxybenzo[h]-quinolinato)beryllium (BeBq$_2$), or bis(2-methyl-8-quinolinolato)(4-phenylphenolato)aluminum (BAlq) can be used. Alternatively, a metal complex having an oxazole-based or thiazole-based ligand, such as bis[2-(2-hydroxyphenyl) benzoxazolato]zinc (Zn(BOX)$_2$) or bis[2-(2-hydroxyphenyl) benzothiazolato]zinc (Zn(BTZ)$_2$) can be used. Besides the metal complexes, 2-(4-biphenylyl)-5-(4-tert-butylphenyl)-1, 3,4-oxadiazole (PBD), 1,3-bis[5-(p-tert-butylphenyl)-1,3,4-oxadiazol-2-yl]benzene (OXD-7), 3-(4-biphenylyl)-4-phenyl-5-(4-tert-butylphenyl)-1,2,4-triazole (TAZ), bathophenanthroline (BPhen), bathocuproine (BCP), or the like can also be used. The substances described here are mainly those having an electron mobility of greater than or equal to $10^{-6}$ cm$^2$:DVs. Note that a substance other than the above substances may also be used as the electron-transporting layer as long as an electron-transporting property thereof is higher than a hole-transporting property thereof.

Further, the electron-transporting layer may be formed as not only a single layer but also as a stacked layer in which two or more layers formed using the above mentioned substances are stacked.

Further, a layer for controlling transport of electrons may be provided between the electron-transporting layer and the light-emitting layer. The layer for controlling transport of electrons is a layer in which a small amount of a substance having a high electron-trapping property is added to a layer containing the above-mentioned substances having a high electron-transporting property. The layer for controlling transport of electrons controls transport of electrons, which enables adjustment of carrier balance. Such a structure is very effective in suppressing a problem (such as shortening of element lifetime) caused by a phenomenon that an electron passes through the light-emitting layer.

Further, an electron-injecting layer may be provided so as to be in contact with the electrode functioning as a cathode. As the electron-injecting layer, an alkali metal, an alkaline earth metal, or a compound thereof, such as lithium fluoride (LiF), cesium fluoride (CsF), calcium fluoride (CaF$_2$), or the like can be employed. For example, a layer which contains both a substance having an electron-transporting property and an alkali metal, an alkaline earth metal, or a compound thereof, e.g., a layer of Alq containing magnesium (Mg), can be used. Note that electrons can be efficiently injected from the second electrode 120 by using, as the electron-injecting layer, a layer containing a substance having an electron-transporting property to which an alkali metal or an alkaline earth metal is added.

The second electrode 120 is formed over the EL layer 119. When the second electrode 120 is used as a cathode, a metal, an alloy, an electrically conductive compound, a mixture thereof, or the like having a low work function (specifically, a work function of less than or equal to 3.8 eV), can be used as a substance for the second electrode 120. As a specific example of such a cathode material, an element belonging to Group 1 or Group 2 of the periodic table, i.e., an alkali metal such as lithium (Li) or cesium (Cs), an alkaline earth metal such as magnesium (Mg), calcium (Ca), or strontium (Sr), an alloy containing any of these metals (such as MgAg or AlLi), a rare earth metal such as europium (Eu) or ytterbium (Yb), an alloy containing such a rare earth metal, or the like can be used. However, when the electron-injecting layer is provided between the cathode and the electron-transporting layer, any of a variety of conductive materials such as Al, Ag, ITO, indium oxide-tin oxide containing silicon or silicon oxide, and the like can be used regardless of its work function as the cathode. Films of these conductive materials can be formed by a sputtering method, an ink-jet method, a spin coating method, or the like.

It is preferable that, when the second electrode 120 is used as an anode, the second electrode 120 be formed using a metal, an alloy, a conductive compound, a mixture thereof, or the like having a high work function (specifically greater than or equal to 4.0 eV). In specific, an example thereof is indium oxide-tin oxide (ITO: indium tin oxide), indium oxide-tin oxide containing silicon or silicon oxide, indium oxide-zinc oxide (IZO: indium zinc oxide), indium oxide containing tungsten oxide and zinc oxide (IWZO), or the like. Such conductive metal oxide films are usually formed by a sputtering method, but may also be formed by using a sol-gel method or the like. For example, indium oxide-zinc oxide (IZO) can be formed by a sputtering method using a target in which 1 wt % to 20 wt % of zinc oxide is added to indium oxide. Indium oxide containing tungsten oxide and zinc oxide (IWZO) can be formed by a sputtering method using a target in which 0.5 wt % to 5 wt % of tungsten oxide and 0.1 wt % to 1 wt % of zinc oxide are added to indium oxide. In addition, gold (Au), platinum (Pt), nickel (Ni), tungsten (W), chromium (Cr), molybdenum (Mo), iron (Fe), cobalt (Co), copper (Cu), palladium (Pd), a nitride of a metal material (such as titanium nitride), or the like can be given. By forming the above-mentioned composite material so as to be in contact with the anode, a material for the electrode can be selected regardless of its work function.

Figure 6A:
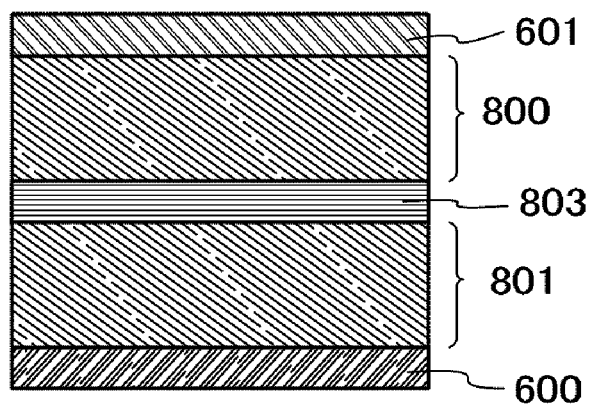
FIGS. 6A and 6B each illustrate a structure of a light-emitting element according to an embodiment.

Note that a plurality of the above-mentioned EL layers may be formed between a first electrode 600 and a second electrode 601 as illustrated in FIG. 6A. In this case, a charge generation layer 803 is preferably provided between stacked EL layers 800 and 801. The charge generation layer 803 can be formed by using the above-mentioned composite material. Further, the charge generation layer 803 may have a stacked layer structure including a layer containing the composite material and a layer containing another material. In this case, as the layer containing another material, a layer containing a substance with an electron-donating property and a substance with a high electron-transporting property, a layer of a conductive film having a light-transmitting property with respect to visible light, and the like can be used. As for a light-emitting element having such a structure, problems such as energy transfer and quenching occur with difficulty, and a light-emitting element which has both high light emission efficiency and long lifetime can be easily obtained due to expansion in the choice of materials. Moreover, a light-emitting element which provides phosphorescence from one of the EL layers and fluorescence from the other of the EL layers can be readily obtained. Note that this structure can be combined with the above-mentioned structures of the EL layer.

Figure 6B:
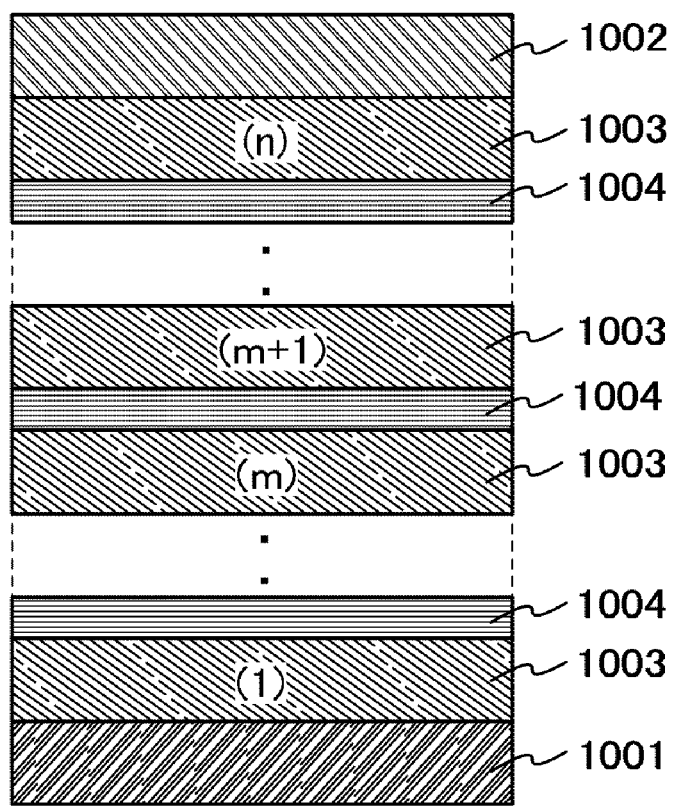

Next, the case where two or more EL layers are stacked between the first electrode and the second electrode will be described. As illustrated in FIG. 6B, in the case of a structure in which n (n is a natural number of 2 or more) EL layers 1003 are stacked, a charge generation layer 1004 is provided between an m-th (m is a natural number, $1 \leq m \leq n-1$) EL layer and an (m+1)-th EL layer.

Note that the charge generation layer 1004 has a function of injecting holes to one EL layer 1003 which is formed in contact with the charge generation layer 1004 and a function of injecting electrons to the other EL layer 1003 which is formed in contact with the charge generation layer 1004, when voltage is applied to a first electrode 1001 and a second electrode 1002.

The charge generation layer 1004 can be formed using, for example, a composite material of an organic compound and a metal oxide. In addition, the charge generation layer 1004 can be formed with a combination of the composite material of an organic compound and a metal oxide with another material (such as an alkali metal, an alkaline metal, or a compound thereof). For example, a stacked layer structure including a layer formed using the composite material of an organic compound and a metal oxide and a layer formed using another material (such as an alkali metal, an alkaline metal, or a compound thereof) may be employed. The composite material of an organic compound and a metal oxide includes, for example, an organic compound and a metal oxide such as $V_2O_5$, $MoO_3$, or $WO_3$. As the organic compound, various compounds such as an aromatic amine compound, a carbazole derivative, aromatic hydrocarbon, and a high-molecular compound (such as oligomer, dendrimer, or polymer) can be used. Note that an organic compound having a hole mobility of greater than or equal to $10^{-6}$ cm$^2$:DVs is preferably used as a hole-transporting organic compound. However, other substances may also be used as long as a hole-transporting property thereof is higher than an electron-transporting property thereof. These materials used for the charge generation layer 1004 are excellent in carrier-injecting property and carrier-transporting property, and thus, a light-emitting element which can be driven with low current can be obtained.

In particular, the structure of FIG. 6A is preferable in the case of obtaining white light emission. When the structure of FIG. 6A is combined with any of the structures in FIGS. 2A to 2D, a full-color flexible light-emitting device with long lifetime and high efficiency can be manufactured.

As for the combination of a plurality of light-emitting layers, a structure for emitting white light by including light of red, light of green, and light of blue may be used. For example, the structure may include a first EL layer containing a blue fluorescent material as a light-emitting substance and a second EL layer containing red and green phosphorescent materials as light-emitting substances. Also with a structure including light-emitting layers emitting light of complementary colors, white light emission can be obtained. When light emission from the first EL layer and light emission from the second EL layer have complementary colors to each other in an element including two EL layers stacked, the combination of colors are as follows: blue and yellow, blue-green and red, and the like. A substance which emits light of blue, yellow, blue-green, or red light may be selected as appropriate from, for example, the light-emitting substances given above.

The following will describe an example of a structure in which white light emission can be obtained by including a plurality of light-emitting layers (a first EL layer and a second EL layer) emitting light of complementary colors.

For example, the first EL layer includes a first light-emitting layer which exhibits light emission with a spectrum whose peak is in the wavelength range of blue to blue-green, and a second light-emitting layer which exhibits light emission with a spectrum whose peak is in the wavelength range of yellow to orange. The second EL layer includes a third light-emitting layer which exhibits light emission with a spectrum whose peak is in the wavelength range of blue-green to green, and a fourth light-emitting layer which exhibits light emission with a spectrum whose peak is in the wavelength range of orange to red.

In this case, light emission from the first EL layer is a combination of light emission from both the first light-emitting layer and the second light-emitting layer and thus exhibits a light emission spectrum having peaks both in the wavelength range of blue to blue-green and in the wavelength range of yellow to orange. That is, the first EL layer exhibits light emission which has a 2-wavelength-type white color or a 2-wavelength-type color that is similar to white.

In addition, light emission from the second EL layer is a combination of light emission from both the third light-emitting layer and the fourth light-emitting layer and thus exhibits a light emission spectrum having peaks both in the wavelength range of blue-green to green and in the wavelength range of orange to red. That is, the second EL layer exhibits light emission which has a 2-wavelength-type white color or a 2-wavelength-type color that is similar to white, which is different from the first EL layer.

Accordingly, by combining the light-emission from the first EL layer and the light emission from the second EL layer, white light emission which covers the wavelength range of blue to blue-green, the wavelength range of blue-green to green, the wavelength range of yellow to orange, and the wavelength range of orange to red can be obtained.

Note that in the structure of the above-mentioned stacked element, by providing the charge generation layer between the stacked EL layers, the element can have long lifetime in a high-luminance region while keeping the current density low. In addition, the voltage drop due to resistance of the electrode material can be reduced, whereby uniform light emission in a large area is possible.

When the components up to the second electrode 120 are formed, the metal substrate 122 is adhered to the second electrode 120 with the second adhesive layer 121. The second adhesive layer 121 can be formed using a material similar to that of the first adhesive layer 111. A material for forming the metal substrate is not limited to a particular material, but it is preferable to use aluminum, copper, nickel, an alloy such as an aluminum alloy or stainless steel, or the like (FIG. 3E). Before the metal substrate 122 is adhered with the second adhesive layer 121, preferably, baking or plasma treatment is performed in vacuum so that water attached to the surface of the metal substrate 122 is removed.

The metal substrate 122 can also be adhered with the use of a laminator. For example, there are a method in which a sheet-like adhesive is attached to the metal substrate using a laminator and the metal substrate with the sheet-like adhesive is further adhered to the light-emitting element using a laminator, a method in which an adhesive is printed on the metal substrate by screen printing or the like and the metal substrate with the adhesive is adhered to the light-emitting element using a laminator, and the like. These processes are preferably performed under reduced pressure in order to reduce bubbles between the light-emitting element and the metal substrate.

In the above manner, a light-emitting device according to one embodiment of the present invention as illustrated in FIGS. 1A to 1C can be manufactured.

This embodiment describes a method in which a flexible light-emitting device having a TFT is formed by forming the components up to the first electrode 117 of the light-emitting element over the formation substrate and separating them, but the invention disclosed in this specification is not limited thereto. After the components up to the light-emitting element 127 are formed (that is, after the second electrode 120 of the light-emitting element is formed), the components may be separated and transferred. Alternatively, after only the protective film 112 may be formed over the formation substrate, and separated and transferred to the plastic substrate 110, a TFT or a light-emitting element may be manufactured. In the case where a TFT is not provided, the light-emitting device can be manufactured in a similar manner by starting the process from the formation of the first electrode 117 of the light-emitting element over the protective film 112.

Note that after the second electrode 120 of the light-emitting element is formed, the film sealing layer 126 may be formed so as to further reduce permeability, as illustrated in FIG. 1C. In addition, the coat film 124 may be provided on the surface of the plastic substrate 110, which is opposite to the surface in contact with the first adhesive layer 111, thereby preventing scratches on the screen or breaking due to the pressure. Furthermore, the resin layer 123 may be provided over the metal substrate 122 to protect the metal substrate.

In addition, the plastic substrate 110, the first adhesive layer 111, the second adhesive layer 121, and the resin layer 123 may include a fibrous body therein. The fibrous body is a high-strength fiber of an organic compound or an inorganic compound. A high-strength fiber is specifically a fiber with a high tensile modulus of elasticity or a fiber with a high Young's modulus. As a typical example of a high-strength fiber, a polyvinyl alcohol based fiber, a polyester based fiber, a polyamide based fiber, a polyethylene based fiber, an aramid based fiber, a polyparaphenylene benzobisoxazole fiber, a glass fiber, or a carbon fiber can be given. As the glass fiber, a glass fiber using E glass, S glass, D glass, Q glass, or the like can be given. These fibers may be used in a state of a woven fabric or a nonwoven fabric, and impregnated with an organic resin, and the organic resin is cured to obtain a structure body. This structure body may be used as the plastic substrate 110. When the structure body including the fibrous body and the organic resin is used as the plastic substrate 110, reliability against bending or breaking due to local pressure can be increased, which is preferable.

In the case where the plastic substrate 110 or the first adhesive layer 111 includes the above-mentioned fibrous body, in order to reduce prevention of light emitted from the light-emitting element to the outside, the fibrous body is preferably a nanofiber with a diameter of less than or equal to 100 nm. Further, refractive indexes of the fibrous body and the organic resin or the adhesive preferably match with each other.

In addition, the structure body obtained by the process in which the fibrous body is impregnated with the organic resin and the organic resin is cured can also be used to serve as both the first adhesive layer 111 and the plastic substrate 110. At this time, as the organic resin for the structure body, a reactive curable resin, a thermal curable resin, a UV curable resin, or the like which is better cured by additional treatment is preferably used.

Then, a flexible printed circuit (FPC) is attached to each electrode of an input-output terminal portion with an anisotropic conductive member. An IC chip or the like may also be mounted if necessary.

Through the above process, a module type light-emitting device to which the FPC is connected is completed.

Figure 4A:
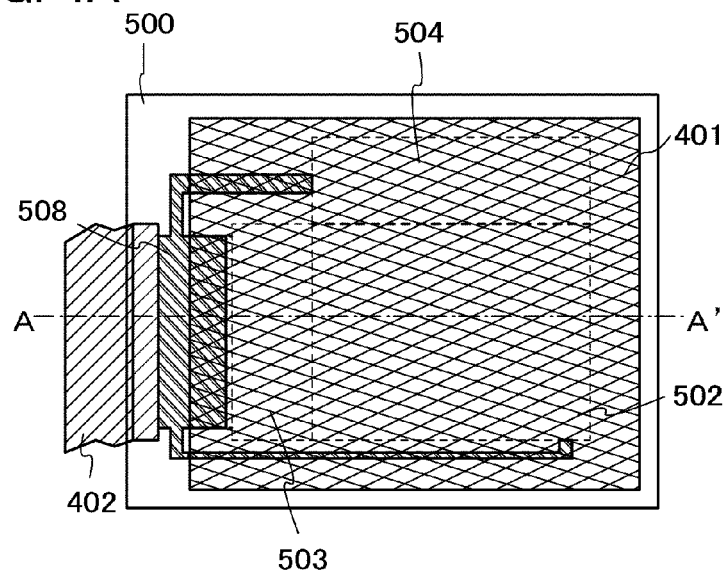
FIGS. 4A to 4C each illustrate a light-emitting device according to an embodiment.
Figure 4B:
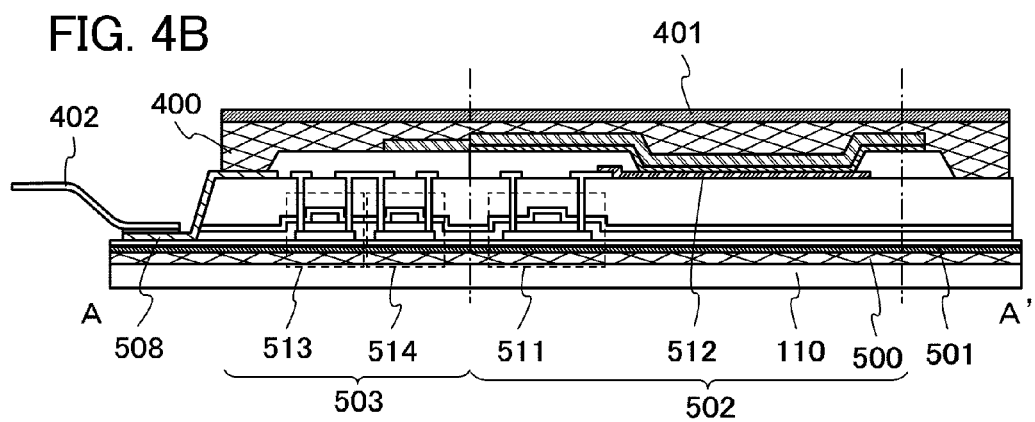
Figure 4C:
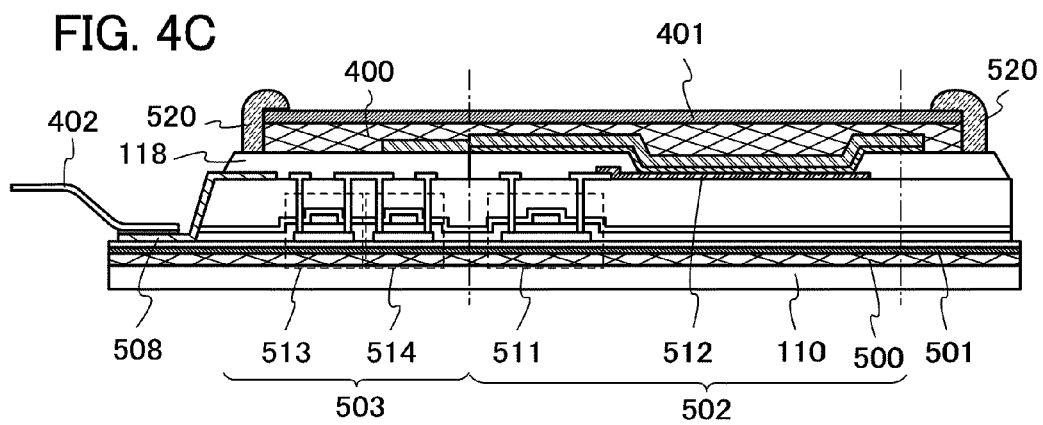

FIG. 4A is a top view and FIGS. 4B and 4C are cross-sectional views of a module type light-emitting device (also referred to as an EL module).

FIG. 4A is a top view illustrating an EL module, and FIG. 4B is a cross-sectional view along line A-A' of FIG. 4A. In FIG. 4A, a protective film 501 is provided over a plastic substrate 110 with a first adhesive layer 500 interposed therebetween. Over the protective film 501, a pixel portion 502, a source side driver circuit 504, and a gate side driver circuit 503 are formed.

Reference numeral 400 denotes a second adhesive layer and reference numeral 401 denotes a metal substrate. The second adhesive layer 400 is formed over the pixel portion and the driver circuit portions, and the metal substrate 401 is adhered with the second adhesive layer 400. Further, the metal substrate 401 may be protected by providing a resin layer thereover.

Reference numeral 508 denotes a wiring for transmitting signals input to the source side driver circuit 504 and the gate side driver circuit 503, which receives video signals or clock signals from a flexible printed circuit (FPC) 402 which is an external input terminal. Although only the FPC 402 is illustrated here, this FPC may be provided with a printed wiring board (PWB). The flexible light-emitting device disclosed in this specification means not only the light-emitting device itself but also a condition in which the FPC or the PWB is attached to the light-emitting device.

Next, a cross-sectional structure will be described with reference to FIG. 4B. The protective film 501 is provided on and in contact with the first adhesive layer 500, the pixel portion 502 and the gate side deriver circuit 503 are formed over the protective film 501, and the pixel portion 502 includes a plurality of pixels each including a current control TFT 511 and a pixel electrode 512 electrically connected to a drain of the current control TFT 511. Further, the gate side driver circuit 503 is formed using a CMOS circuit that combines an n-channel TFT 513 and a p-channel TFT 514.

FIG. 4C illustrates an example of a cross-sectional structure which is different from FIG. 4B. In the example of FIG. 4C, a partition wall 118 is formed using an inorganic material such as silicon nitride, silicon oxynitride, silicon nitride oxide, or silicon oxide. The peripheral end portions of the second adhesive layer 400 and the metal substrate 401 are placed closer to the center of the flexible light-emitting device than the peripheral end portion of the partition wall 118. That is, the areas of the second adhesive layer 400 and the metal substrate 401 are smaller than the area of the partition wall 118, and the second adhesive layer 400 and the metal substrate 401 are placed over the partition wall 118 so as not to extend beyond the partition wall 118. Then, a low-melting point metal 520 is formed so as to cover the side surface of the second adhesive layer 400. With the low-melting point metal 520, moisture can be blocked highly effectively at the end portion on the side surface of the second adhesive layer 400, and thus, the lifetime of the flexible light-emitting device can be further improved. The low-melting point metal 520 is not limited to a particular metal, but a metal material which can be fused at approximately 45° C. to 300° C. is preferably used. When the fusion temperature is about 300° C., the temperature rises locally in the peripheral portion of the pixel portion and over the partition wall, and the low-melting point metal can be fused without damaging the light-emitting element or the plastic substrate. As such a material, a metal material containing tin, silver, copper, indium, or the like can be given. In addition, bismuth or the like may be further contained therein.

Figure 11A:
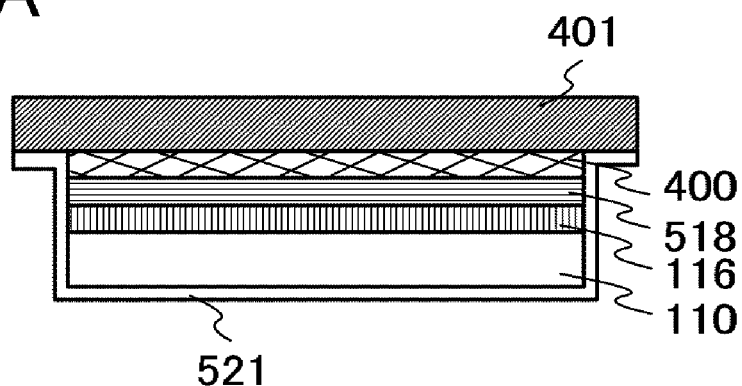
FIGS. 11A and 11B each illustrate a light-emitting device according to an embodiment.
Figure 11B:
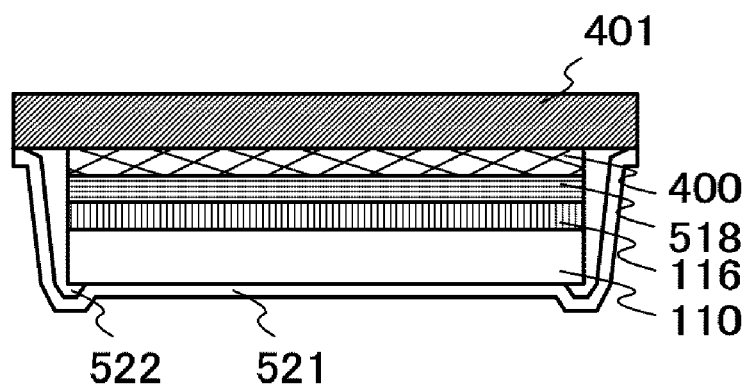

FIGS. 11A and 11B illustrate other structures which can effectively prevent moisture from entering from the peripheral end portion of the light-emitting device. The metal substrate 401 of the light-emitting device illustrated in FIG. 11A is larger than the second adhesive layer 400, a light-emitting element 518, the layer 116 to be separated, and the plastic substrate 110. The end portion of the metal substrate 401 is outside the peripheral portions of the second adhesive layer 400, the light-emitting element 518, the layer 116 to be separated, and the plastic substrate 110. In addition, a sealing film 521 covers the second adhesive layer 400, the light-emitting element 518, the layer 116 to be separated, and the plastic substrate 110, and is in contact with the surface of the metal substrate 401. The sealing film 521 is formed using a material having low permeability and a light-transmitting property with respect to visible light. Typically, an inorganic material such as an insulating film containing nitrogen and silicon, e.g., a silicon nitride film, a silicon nitride oxide film, or a silicon oxynitride film is preferably used. The sealing film 521 with such a structure can prevent moisture from entering the light-emitting device from the end portions and the interfaces of the second adhesive layer 400, the light-emitting element 518, the layer 116 to be separated, and the plastic substrate 110 which are included in the light-emitting device.

In addition, the light-emitting device illustrated in FIG. 11B is provided with a planarization layer 522 at the end portions of the second adhesive layer 400, the light-emitting element 518, the layer 116 to be separated, and the plastic substrate 110. The planarization layer 522 can be formed using a resin. With the planarization layer 522, a step formed by the stacked layer structure of the second adhesive layer 400, the light-emitting element 518, the layer 116 to be separated, and the plastic substrate 110 can be reduced. The sealing film 521 can easily cover the end portions where the step has become gentle with the planarization layer 522. With this structure, the sealing film 521 can more effectively prevent moisture from entering the light-emitting device from the end portions and the interfaces of the second adhesive layer 400, the light-emitting element 518, the layer 116 to be separated, and the plastic substrate 110 which are included in the light-emitting device. Note that the planarization layer 522 may be formed by coating so as to cover not only the end portions but also the entire surface of the plastic substrate 110.

As described above, in the flexible light-emitting device described in this embodiment, a TFT can be formed over a formation substrate with high heat resistance and thus a TFT using a crystalline semiconductor layer such as crystalline silicon having high mobility can be formed. Accordingly, a driver circuit portion can be partially formed at the same time when a pixel portion is formed, whereby the flexible light-emitting device can be manufactured at lower cost.

Embodiment 2

In this embodiment, an electronic device including the light-emitting device described in Embodiment 1 as a part thereof will be described.

Examples of the electronic device including the light-emitting element described in Embodiment 1 include cameras such as video cameras or digital cameras, goggle type displays, navigation systems, audio playback devices (e.g., car audio systems and audio systems), computers, game machines, portable information terminals (e.g., mobile computers, mobile phones, portable game machines, and electronic book devices), image playback devices in which a recording medium is provided (specifically, devices that are capable of playing back recording media such as digital versatile discs (DVDs) and equipped with a display unit that can display images), and the like. Such electronic devices are illustrated in FIGS. 5A to 5E.

Figure 5A:
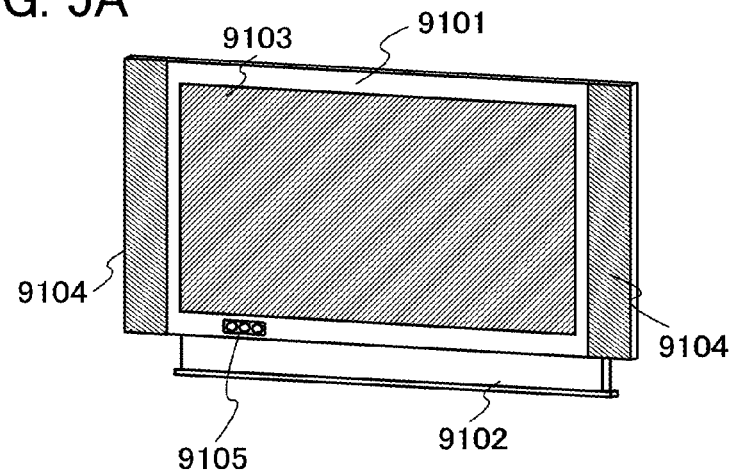
FIGS. 5A to 5E each illustrate an electronic device according to an embodiment.

FIG. 5A illustrates a television device which includes a housing 9101, a support 9102, a display portion 9103, speaker portions 9104, video input terminals 9105, and the like. In this television device, the display portion 9103 is manufactured using the light-emitting device described in Embodiment 1. The television device is provided with the light-emitting device described in Embodiment 1 which is flexible, has long lifetime, and can easily be manufactured. The display portion 9103 can perform display also when being curved and is lightweight, and thus, the television device can be a relatively inexpensive product with long lifetime.

Figure 5B:
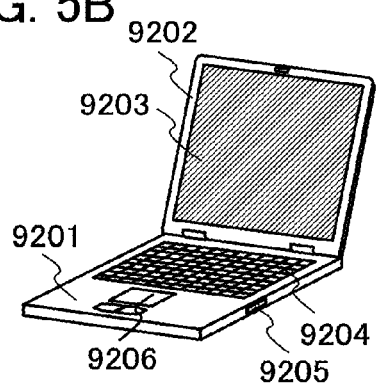

FIG. 5B illustrates a computer which includes a main body 9201, a housing 9202, a display portion 9203, a keyboard 9204, an external connection port 9205, a pointing device 9206, and the like. In this computer, the display portion 9203 is manufactured using the light-emitting device described in Embodiment 1. The computer is provided with the light-emitting device described in Embodiment 1 which is flexible, has long lifetime, and can easily be manufactured. The display portion 9203 can perform display also when being curved and is lightweight, and thus, the computer can be a relatively inexpensive product with long lifetime.

Figure 5C:
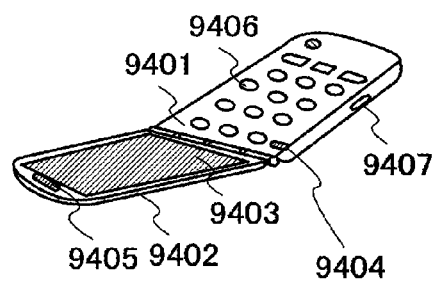

FIG. 5C illustrates a mobile phone which includes a main body 9401, a housing 9402, a display portion 9403, an audio input portion 9404, an audio output portion 9405, operation keys 9406, an external connection port 9407, and the like. In this mobile phone, the display portion 9403 is manufactured using the light-emitting device described in Embodiment 1. The mobile phone is provided with the light-emitting device described in Embodiment 1 which is flexible, has long lifetime, and can easily be manufactured. The display portion 9403 can perform display also when being curved and is lightweight and furthermore can provide images with high quality. The lightweight mobile phone of this embodiment can have appropriate weight for being carried even when a variety of additional values are added thereto, and thus the mobile phone is also suitable for use as a highly functional mobile phone.

Figure 5D:
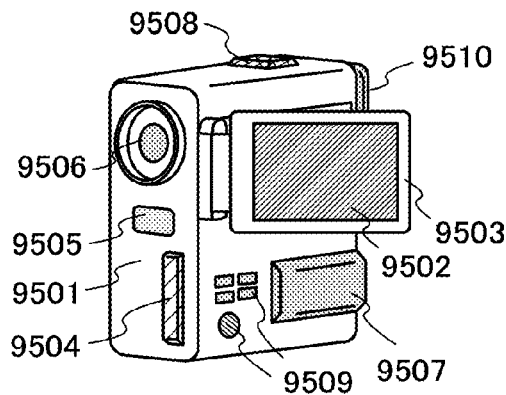

FIG. 5D illustrates a camera which includes a main body 9501, a display portion 9502, a housing 9503, an external connection port 9504, a remote control receiving portion 9505, an image receiving portion 9506, a battery 9507, an audio input portion 9508, operation keys 9509, an eyepiece portion 9510, and the like. In this camera, the display portion 9502 is manufactured using the light-emitting device described in Embodiment 1. The camera is provided with the light-emitting device described in Embodiment 1 which is flexible, has long lifetime, and can easily be manufactured. The display portion 9502 can perform display also when being curved and is lightweight, and thus, the camera can be a relatively inexpensive product with long lifetime.

Figure 5E:
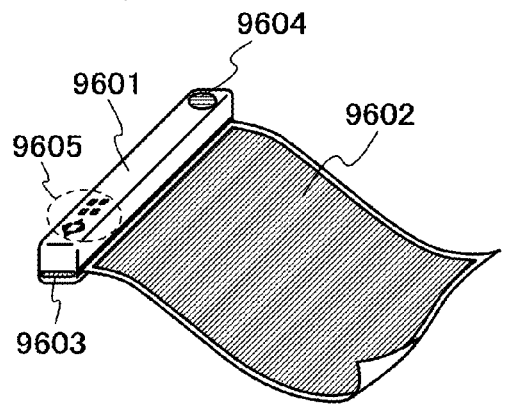

FIG. 5E illustrates a display which includes a main body 9601, a display portion 9602, an external memory insertion portion 9603, a speaker portion 9604, operation keys 9605, and the like. The main body 9601 may be provided with an antenna for receiving a television broadcast, an external input terminal, an external output terminal, a battery, and the like. In this display, the display portion 9602 is manufactured using the light-emitting device described in Embodiment 1. The flexible display portion 9602 can be rolled up and stored in the main body 9601 and is suitable for being carried. The display is provided with the light-emitting device described in Embodiment 1 which is flexible, has long lifetime, and can easily be manufactured. The display portion 9602 can be suitable for being carried and is lightweight, and thus, the display can be a relatively inexpensive product with long lifetime.

As described above, the application range of the light-emitting device described in Embodiment 1 is so wide that the light-emitting device can be applied to electronic devices of various fields.

Embodiment 3

Since a plastic substrate is used for a flexible light-emitting device, a flexible light-emitting device is more often electrically charged than a light-emitting device using a glass substrate or the like. Therefore, in this embodiment, an example is shown, in which a transparent conductive film is used for the coat film 124 in FIG. 1C to manufacture a flexible light-emitting device which is resistant to static electricity.

A structure in which the coat film 124 which is a transparent conductive film is provided on the surface of the plastic substrate 110, which is opposite to the surface in contact with the first adhesive layer 111, is employed. The coat film 124 which is a transparent conductive film may be formed after the FPC 402 is attached, after the metal substrate 401 is attached, or before the FPC 402 is attached.

A transparent conductive film which is used for the coat film 124 is formed using indium oxide ($In_2O_3$), tin oxide, an alloy of indium oxide and tin oxide ($In_2O_3$—$SnO_2$, abbreviated to ITO), indium oxide containing tungsten oxide, indium zinc oxide containing tungsten oxide, indium oxide containing titanium oxide, indium zinc oxide, indium tin oxide to which silicon oxide is added, antimony oxide, or the like by a sputtering method, a printing method, a vacuum evaporation method, or the like.

With the above structure, even when an electrostatically-charged hand, finger, or the like of the human touches the plastic substrate 110 covered with the coat film 124 which is a transparent conductive film and electricity is discharged, the TFTs (such as the n-channel TFT 513 and the p-channel TFT 514) and the pixel portion 502 can be protected.

In addition, the coat film 124 which is a transparent conductive film can protect the surface of the soft plastic substrate 110 from scratches and the like.

Figure 12A:
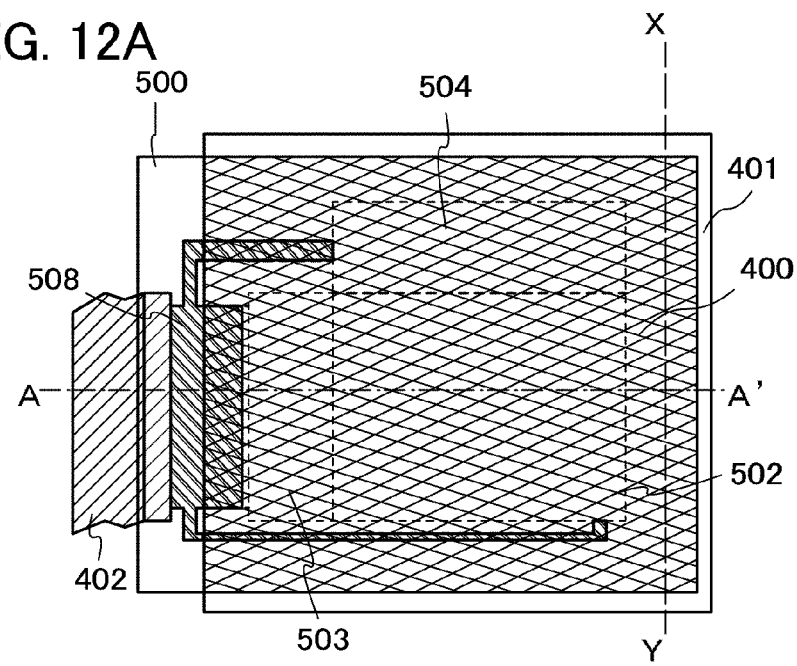
FIGS. 12A to 12C illustrate a light-emitting device according to an embodiment.
Figure 12B:
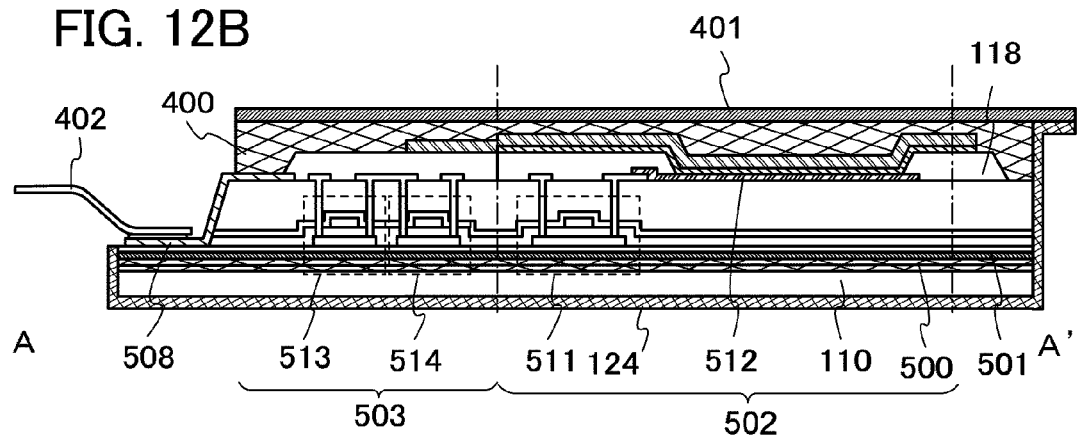
Figure 12C:
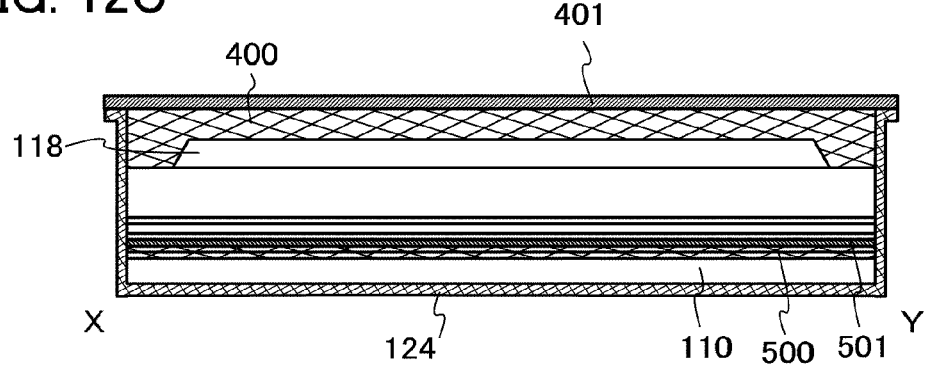

Further, the coat film 124 which is a transparent conductive film and the metal substrate 401 preferably have electrical continuity therebetween, and FIGS. 12A to 12C illustrate examples of such a structure. In this case, a conductive substrate is used for the metal substrate 401.

FIGS. 12A to 12C are only partially different from FIGS. 4A to 4C, and thus, identical portions are denoted by the same reference numerals.

FIG. 12A is a top view illustrating an EL module, and FIG. 12B is a cross-sectional view along chain line A-A' of FIG. 12A. FIG. 12C is a cross-sectional view along dotted line X-Y of FIG. 12A.

In FIG. 12A, a protective film 501 is provided over a plastic substrate 110 with a first adhesive layer 500 interposed therebetween. Over the protective film 501, a pixel portion 502, a source side driver circuit 504, and a gate side driver circuit 503 are formed. These pixel portion and driver circuits can be obtained as described in Embodiment 1.

Reference numeral 400 denotes a second adhesive layer and reference numeral 401 denotes a metal substrate. The second adhesive layer 400 is formed over the pixel portion and the driver circuit portions, and the metal substrate 401 is adhered with the second adhesive layer 400. The metal substrate 401 has a region which does not overlap with the plastic substrate 110, and a coat film 124 which is a transparent conductive film is formed on that region. In addition, the coat film 124 which is a transparent conductive film is also formed on the side surface of the plastic substrate 110, the side surface of the first adhesive layer 500, the side surface of the protective film 501, the side surface of a gate insulating film, the side surface of an interlayer insulating film, the side surface of the second adhesive layer 400, and the like. The coat film 124 which is a transparent conductive film is formed on these side surfaces, whereby the metal substrate 401 and the coat film 124 have electrical continuity therebetween.

In addition, the metal substrate 401 and the coat film 124 are disposed so as to surround the plastic substrate 110 as illustrated in FIG. 12C and thus the metal substrate and the coat film 124 have electrical continuity therebetween, whereby the flexible light-emitting device can be effectively prevented from being electrostatically-charged.

In this embodiment, a film of an alloy of indium oxide and tin oxide with a thickness of 110 nm is formed on the plastic substrate 110 and the metal substrate 401 which is a stainless steel substrate.

While the transparent conductive film is formed by a sputtering method, the FPC 402 is protected by being covered with a metal foil or the like so that the transparent conductive film is not formed at an end portion of the FPC 402. It is preferable to form the transparent conductive film also on the side surfaces described above and a part of the metal substrate 401 (a region which does not overlap with the plastic substrate 110). Although not illustrated, if the FPC 402 is not protected by being covered with a metal foil or the like, the transparent conductive film is also formed on the FPC 402.

In addition, the coat film 124 which is a transparent conductive film can protect the surface of the soft plastic substrate 110 from scratches and the like. Furthermore, the coat film 124 which is a transparent conductive film provided on the side surfaces also serves as a protective film which suppresses moisture entering the light-emitting device.

This embodiment can be freely combined with any of other embodiments.

Example 1

Figure 7A:
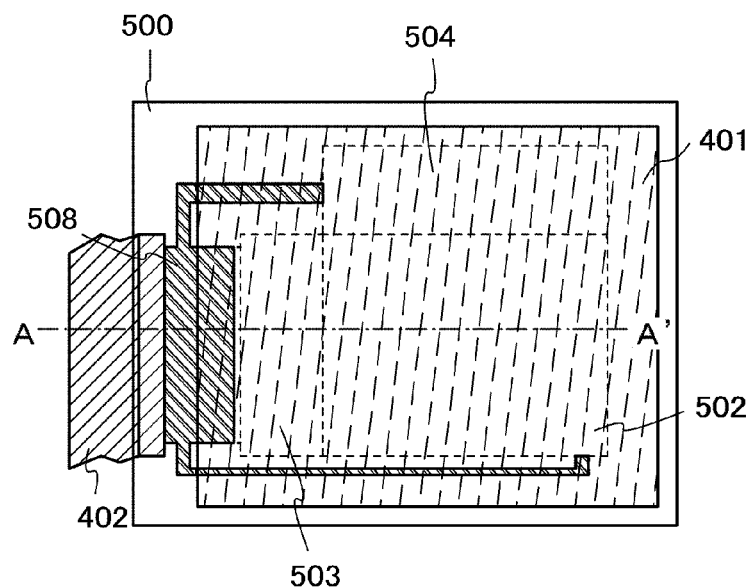
FIGS. 7A to 7C illustrate a light-emitting device according to an example.
Figure 7B:
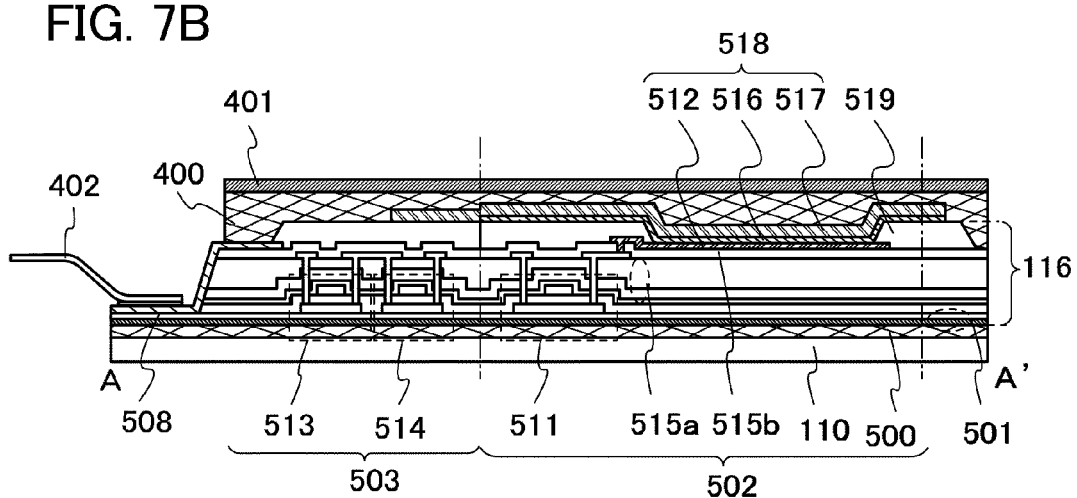

In this example, an active matrix flexible light-emitting device which can be used for an image display device will be described. FIGS. 7A and 7B each illustrate a structure of the light-emitting device described in this example. FIG. 7A is a top view of the active matrix light-emitting device, and FIG. 7B is a cross-sectional view along line A-A' of FIG. 7A.

The flexible light-emitting device which is described in this example includes a plastic substrate 110, a layer 116 to be separated, a light-emitting element 518, and a metal substrate 401.

The plastic substrate 110 to which the layer 116 to be separated is transferred is formed using an aramid film whose light-transmitting property with respect to visible light is greater than or equal to 90%, thermal expansion coefficient is about 10 ppm:DK, and thickness is 20 μm. In addition, a first adhesive layer 500 with which the plastic substrate 110 and the layer 116 to be separated are adhered to each other is formed using a two component type epoxy adhesive (R2007: DH-1010, produced by ALTECO INC.).

The layer 116 to be separated includes a protective film 501, a pixel portion 502, a gate side driver circuit 503, and a source side driver circuit 504. In addition, the pixel portion 502 includes a current control TFT 511 and a pixel electrode 512. The pixel electrode 512 is electrically connected to a drain electrode layer of the current control TFT 511. The current control TFT 511 is a p-channel TFT and the pixel electrode 512 is an anode of the light-emitting element 518.

The protective film 501 is formed using a multi-layer film including a silicon oxynitride (SiOxNy, x>y) layer with a thickness of 200 nm, a silicon nitride (SiNy) layer with a thickness of 200 nm, a silicon oxynitride (SiOxNy, x>y) layer with a thickness of 200 nm, a silicon nitride oxide (SiNyOx, x<y) layer with a thickness of 140 nm, and a silicon oxynitride (SiOxNy, x>y) layer with a thickness of 100 nm. With such a multi-layer structure, water vapor or oxygen can be prevented from entering the light-emitting device from the lower portion of the substrate.

The TFT described in this example is a staggered TFT in which a gate insulating film is provided over a semiconductor layer, a gate electrode layer is provided so as to overlap with the semiconductor layer with the gate insulating film interposed therebetween, and a source electrode layer and a drain electrode layer which are electrically connect a source region and a drain region respectively of the semiconductor layer are provided. The semiconductor layer of the TFT is formed using a polysilicon layer with a thickness of 50 nm, and the gate insulating film thereof is formed using a silicon oxynitride (SiOxNy, x>y) film with a thickness of 110 nm.

Although not illustrated, the gate electrode layer includes two layers, and a lower layer of the gate electrode layer is longer than an upper layer thereof. The lower layer of the gate electrode layer is formed using a tantalum nitride layer with a thickness of 30 nm, and the upper layer thereof is formed using a tungsten (W) layer with a thickness of 370 nm. With such a structure, a lightly doped drain (LDD) region can be formed without using another photomask.

A first interlayer insulating film 515a which is formed over the gate insulating film and the gate electrode layer is formed using a multi-layer film in which a silicon oxynitride (SiOxNy, x>y) layer with a thickness of 50 nm, a silicon nitride oxide (SiNyOx, x<y) layer with a thickness of 140 nm, and a silicon oxynitride (SiOxNy, x>y) layer with a thickness of 520 nm are stacked.

The source electrode layer and the drain electrode layer are formed so as to be connected to the source region and the drain region respectively of the TFT through contact holes in the first interlayer insulating film 515a. The source and drain electrode layers are formed using a multi-layer film including a titanium layer with a thickness of 100 nm, an aluminum layer with a thickness of 700 nm, and a titanium layer with a thickness of 100 nm. In this manner, by stacking aluminum with low electric resistance and titanium with excellent heat resistance, it is possible to suppress wiring resistance and prevent generation of a hillock in the process. A wiring layer is also formed using the same multi-layer although not illustrated.

A second interlayer insulating film 515b which is formed over the TFT is formed using a silicon oxynitride (SiOxNy, x>y) layer with a thickness of 150 nm.

The pixel electrode (first electrode) 512 is formed using a film of indium tin oxide containing silicon oxide (ITSO) with a thickness of 125 nm. In addition, an end portion of the pixel electrode 512 is covered with a partition wall 519 which is formed using photosensitive polyimide. The end portion of the partition wall 519 is in contact with the surface of the pixel electrode 512 and has a gentle angle. A step at the end portion of the partition wall 519 which has a gentle angle and is in contact with the surface of the pixel electrode 512 is reduced, and in a light-emitting element in which the pixel electrode 512 serves as one electrode, the pixel electrode 512 and the other electrode are not easily short-circuited.

In this example, the layer 116 to be separated is formed over a separation layer which is formed over a glass substrate (AN100, produced by Asahi Glass Co., Ltd.) with a thickness of 0.7 mm. The separation layer is formed using a multi-layer film in which a silicon oxynitride (SiOxNy, x>y) layer with a thickness of 100 nm and a tungsten layer with a thickness of 50 nm are stacked.

Figure 7C:
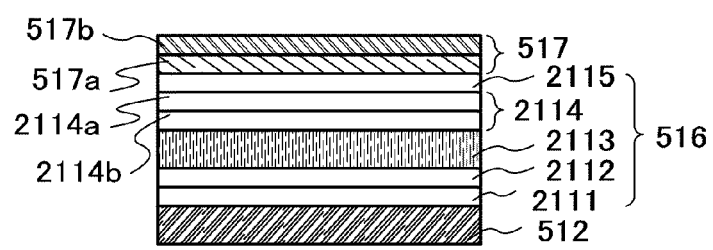

FIG. 7C illustrates the structure of the light-emitting element 518 in which the pixel electrode 512 serves as one electrode. In the light-emitting element 518, the pixel electrode 512 serves as a first electrode, and an EL layer 516 is provided between a second electrode 517 and the pixel electrode 512. Chemical formulas of materials used in this example are shown below.

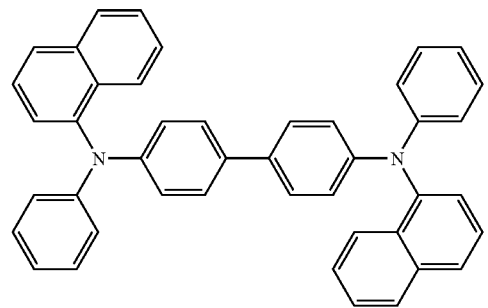

NPB

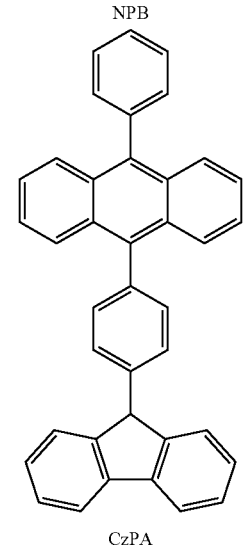

CzPA

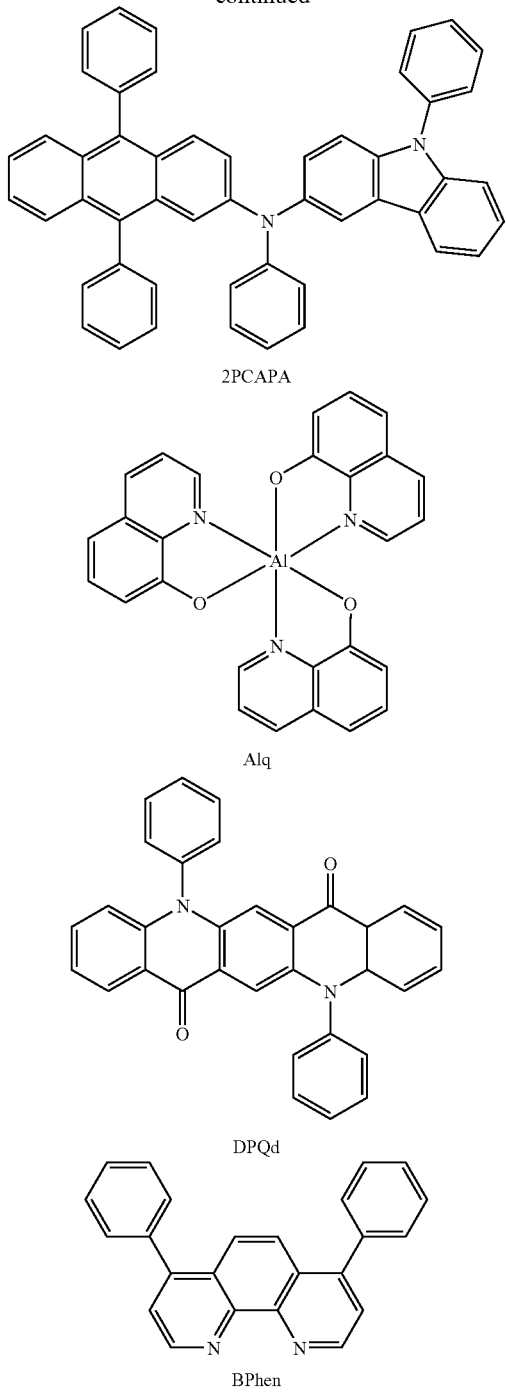

A manufacturing method of the light-emitting element of this example is described below.

First, a substrate provided with the pixel electrode 512 was fixed to a substrate holder in a vacuum evaporation apparatus so that the surface of the substrate, on which the pixel electrode 512 was formed, faced downward. After the pressure was lowered to approximately $10^{-4}$ Pa, a first layer 2111 containing a composite material of an organic compound and an inorganic compound was formed on the pixel electrode 512 as a hole-injecting layer by co-evaporation of 4,4'-bis[N-(1-naphthyl)-N-phenylamino]biphenyl (NPB) and molybdenum(VI) oxide. The thickness of the first layer 2111 was 140 nm, and the weight ratio of NPB to molybdenum(VI) oxide was adjusted to be 1:0.11 (=NPB:molybdenum oxide). A co-evaporation method is an evaporation method by which evaporation is performed from a plurality of evaporation sources at the same time in one treatment chamber.

Next, an NPB film was formed so as to have a thickness of 10 nm on the first layer 2111 containing a composite material by an evaporation method using resistive heating to form a second layer 2112 as a hole-transporting layer.

Then, a third layer 2113 was formed as a light-emitting layer on the second layer 2112 by co-evaporation of 9-[4-(10-phenyl-9-anthryl)phenyl]-9H-carbazole (CzPA) and N-(9,10-diphenyl-2-anthryl)-N,9-diphenyl-9H-carbazol-3-amine (2PCAPA) which is a green light-emitting substance. The thickness of the light-emitting layer was set to be 30 nm, and the evaporation rate was adjusted such that the weight ratio of CzPA to 2PCAPA was 1:0.05 (=CzPA:2PCAPA).

Then, tris(8-quinolinolato)aluminum (Alq) and N,N-diphenylquinacridone (DPQd) which is an electron-trapping substance were co-evaporated on the third layer 2113, so that a first electron-transporting region 2114a was formed. The thickness of the first electron-transporting region 2114a was set to be 10 nm, and the evaporation rate was adjusted such that the weight ratio of Alq to DPQd was 1:0.005 (=Alq:DPQd).

After that, as a second electron-transporting region 2114b, bathophenanthroline (BPhen) was evaporated to a thickness of 30 nm. Accordingly, a fourth layer 2114 including the first electron-transporting region 2114a and the second electron-transporting region 2114b was formed as an electron-transporting layer.

Further, lithium fluoride (LiF) was evaporated on the fourth layer 2114, whereby a fifth layer 2115 was formed as an electron-injecting layer. The thickness of the fifth layer 2115 was set to be 1 nm.

Finally, the second electrode 517 serving as a cathode was formed. The second electrode 517 was formed to include two layers. A first conductive layer 517a which was in contact with the fifth layer 2115 was formed by co-evaporation of aluminum (Al) and NPB. The weight ratio of aluminum to NPB was adjusted to be 5:1 (=Al:NPB). In addition, the thickness of the first conductive layer 517a was set to be 100 nm. Further, as a second conductive layer 517b, aluminum was evaporated on the first conductive layer 517a to have a thickness of 100 nm Note that the second electrode 517 was connected to a terminal portion through a common electrode layer.

Further, in the above evaporation processes, a resistive heating method can be used for each evaporation.

The metal substrate 401 is attached to the layer 116 to be separated and the light-emitting element 518 (the pixel electrode 512 is included in the light-emitting element 518) with an second adhesive layer 400 interposed therebetween, thereby preventing the layer 116 to be separated and the light-emitting element 518 from being exposed to the air. The metal substrate 401 is formed with a ferritic stainless steel substrate (YUS205-M1, produced by Nippon Steel Materials Co., Ltd.) whose thermal expansion coefficient is about 10 ppm:DK and thickness is 20 μm. The second adhesive layer 400 is formed with an acrylic sheet adhesive (8171J, produced by Sumitomo 3M Limited) which is 25 μm thick.

The light-emitting device described in this example is manufactured by the manufacturing method described in Embodiment 1. That is, first, the layer 116 to be separated including the protective film 501, the pixel electrode 512 serving as a first electrode, and the like was formed over the separation layer which was formed over the formation substrate. Then, the layer 116 to be separated was transferred from the formation substrate to the plastic substrate 110 which had a light-transmitting property with respect to visible light and flexibility, using a temporary supporting substrate. After that, the EL layer 516 and the second electrode 517 were formed over the pixel electrode 512 to form the light-emitting element 518. Finally, the layer 116 to be separated and the light-emitting element 518 were sealed by the metal substrate 401 using the second adhesive layer 400, whereby the light-emitting device was manufactured.

Figure 9:
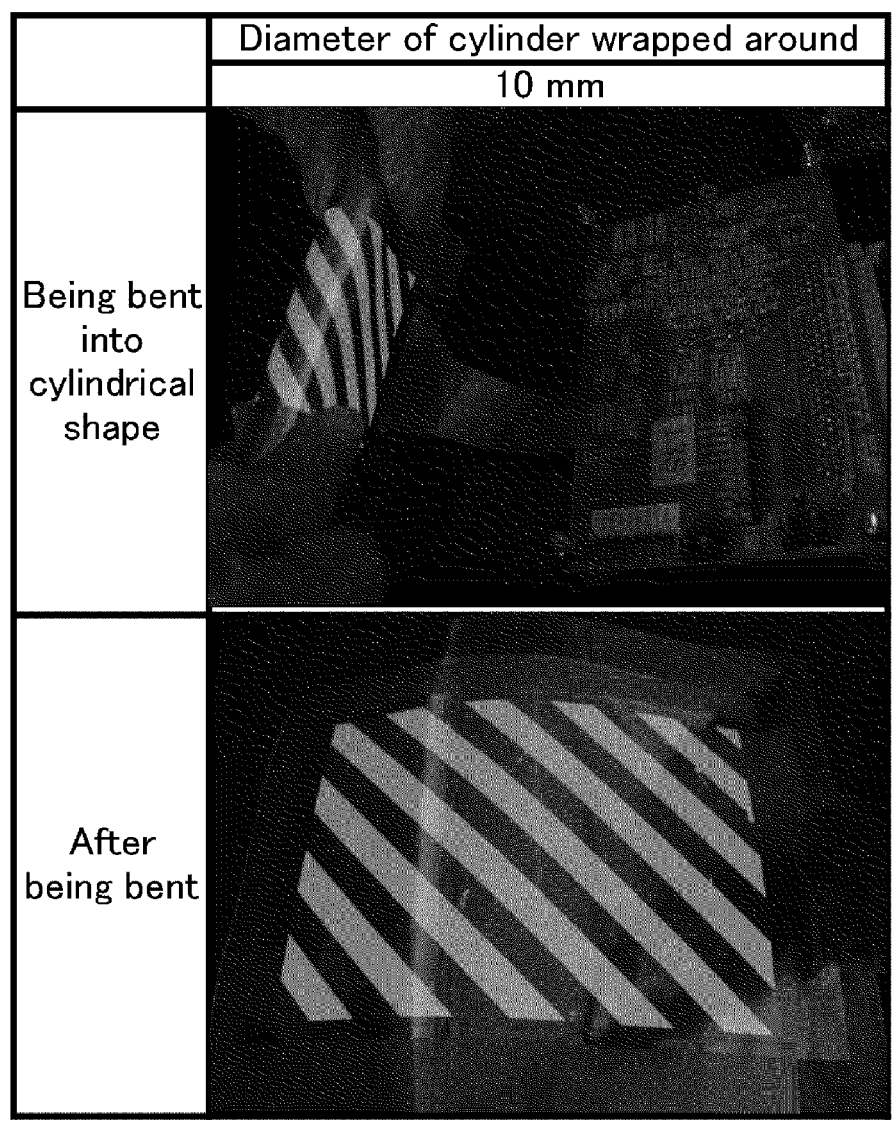
FIG. 9 illustrates a light-emitting device according to an example.

The flexible light-emitting device described in this example was driven while being wrapped around a cylinder whose diameter was 10 mm and a video signal was input. The light-emitting device responded to the video signal and operated normally while being bent into a cylindrical shape. Further, when the light-emitting device was taken off the cylinder and driven, it operated normally in a flat shape. Photographs of light-emitting states are shown in FIG. 9.

The light-emitting device described in this example includes the layer to be separated which is formed using the formation substrate having high heat resistance. As a result, the layer to be separated can be formed using a high-temperature process; thus, the protective film with a high moisture-proof property can be easily formed, and the light-emitting element can be surely and inexpensively protected. In addition, the light-emitting device in this example is flexible and can emit light either in a bent state or a flat state.

The light-emitting device in this example is constructed by a thin film and a metal thin plate. Therefore, the light-emitting device is lightweight and less deformed even when being dropped; moreover, since it is highly flat and less curls along with the change in use environment, the driver circuit of the display device is broken with difficulty. Accordingly, the light-emitting device in this example is suitable to the use in flexible displays.

Example 2

In this example, a flexible light-emitting device which can be used as both a display device and a lighting device will be described. In the light-emitting device of this example, electrode layers of a plurality of light-emitting elements which are connected to a terminal portion without a switching element interposed therebetween are arranged in matrix. Thus, the light-emitting device can be called a passive matrix type and can be used for display devices or backlights of display devices. Note that the light-emitting device can be used as a lighting device even when not a plurality of light-emitting elements but a single light-emitting element is arranged therein.

Figure 8A:
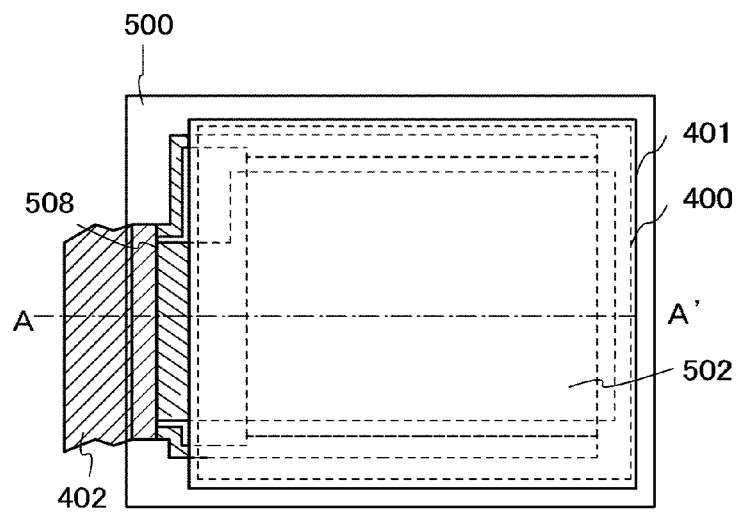
FIGS. 8A and 8B illustrate a light-emitting device according to an example.
Figure 8B:
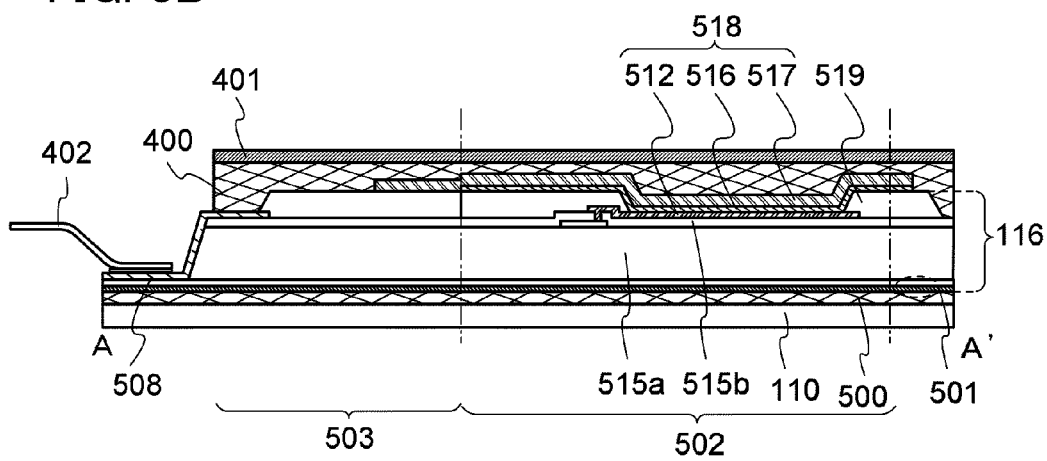

FIGS. 8A and 8B illustrate a structure of a pixel portion of the light-emitting device in this example. FIG. 8A is a top view illustrating the passive matrix light-emitting device and FIG. 8B is a cross-sectional view taken along line A-A' of FIG. 8A.

The flexible light-emitting device of this example includes a plastic substrate 110, a layer 116 to be separated, a light-emitting element 518, and a metal substrate 401. The plastic substrate 110, the light-emitting element 518, and the metal substrate 401 are the same as in Example 1 and thus the description thereof is omitted.

The layer 116 to be separated of this example includes a protective film 501, a pixel electrode 512, interlayer insulating films 515a and 515b, and a partition wall 519.

The protective film 501 is formed with a multi-layer film including a silicon oxynitride (SiOxNy, x>y) layer with a thickness of 200 nm, a silicon nitride (SiNy) layer with a thickness of 200 nm, a silicon oxynitride (SiOxNy, x>y) layer with a thickness of 200 nm, a silicon nitride oxide (SiNyOx, x<y) layer with a thickness of 140 nm, and a silicon oxynitride (SiOxNy, x>y) layer with a thickness of 100 nm.

The first interlayer insulating film 515a is formed using a multi-layer film including a silicon oxynitride (SiOxNy, x>y) layer with a thickness of 50 nm, a silicon nitride oxide (SiNyOx, x<y) layer with a thickness of 140 nm, and a silicon oxynitride (SiOxNy, x>y) layer with a thickness of 520 nm.

A wiring layer is formed using a multi-layer film including a titanium layer with a thickness of 100 nm, an aluminum layer with a thickness of 700 nm, and a titanium layer with a thickness of 100 nm. In addition, the second interlayer insulating film 515b is formed using a silicon oxynitride (SiOxNy, x>y) layer with a thickness of 150 nm.

The pixel electrode 512 is electrically connected to the wiring layer through a contact hole in the second interlayer insulating film 515b. The pixel electrode 512 is formed using a film of indium tin oxide containing silicon oxide (ITSO) with a thickness of 125 nm.

In addition, an end portion of the pixel electrode 512 is covered with the partition wall 519 which is formed using photosensitive polyimide.

In this example, the layer 116 to be separated was formed over the separation layer which was formed over a glass substrate with a thickness of 0.7 mm. The separation layer is formed using a multi-layer film in which a silicon oxynitride (SiOxNy, x>y) layer with a thickness of 100 nm and a tungsten layer with a thickness of 50 nm are stacked.

Figure 10:
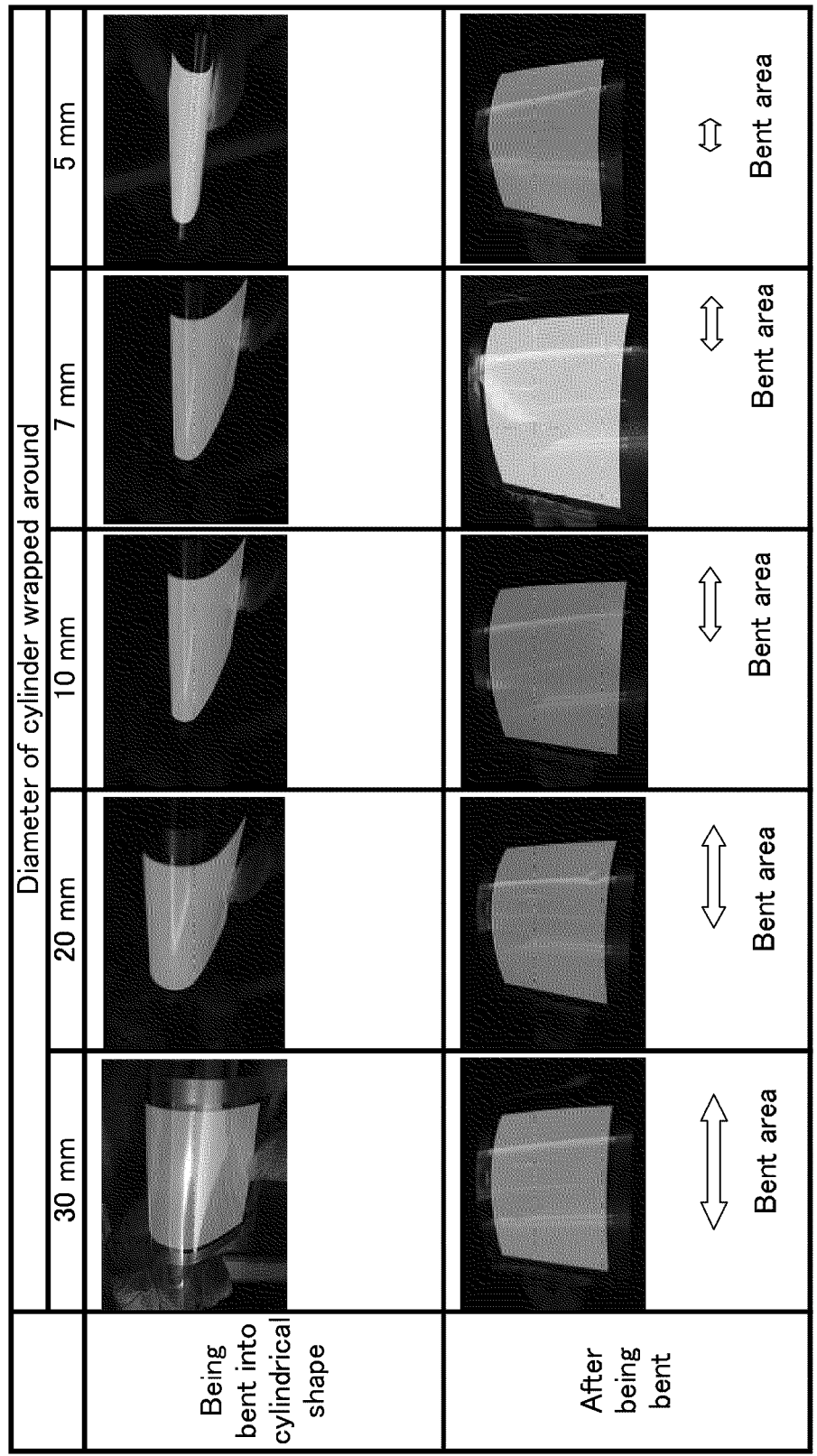
FIG. 10 illustrates a light-emitting device according to an example.

The flexible light-emitting device in this example was driven while being wrapped around a cylinder whose diameter is 5 mm to 30 mm. The light-emitting device emitted light and operated normally while being bent into a cylindrical shape. Further, when the light-emitting device was taken off the cylinder and driven, it emitted light normally in a flat shape, and also emitted light normally even when the light-emitting device was repeatedly wrapped around and taken off the cylinder. Photographs showing light-emitting states are shown in FIG. 10.

The light-emitting device in this example includes the layer to be separated which is formed using the formation substrate having high heat resistance. As a result, the layer to be separated can be formed using a high-temperature process; thus, the protective film with a high moisture-proof property can be easily formed, and the light-emitting element can be surely and inexpensively protected. In addition, the light-emitting device in this example is flexible and can emit light either in a bent state or a flat state.

The light-emitting device in this example is constructed by a thin film and a metal thin plate. Since the light-emitting device is thin, it can be placed in a narrow space or disposed by being deformed along a curved surface. In addition, the light-emitting device is lightweight and thus is suitable to the use in a device whose weight is strictly restricted, such as a portable device or an airplane.

This application is based on Japanese Patent Application serial no. 2008-267774 filed with Japan Patent Office on Oct. 16, 2008, and Japanese Patent Application serial no. 2009-123451 filed with Japan Patent Office on May 21, 2009, the entire contents of which are hereby incorporated by reference.

What is claimed is:
1. A flexible light-emitting device, comprising:
a first substrate having flexibility and a light-transmitting property with respect to visible light;
a first adhesive layer provided over the first substrate;

an insulating film containing nitrogen and silicon provided over the first adhesive layer;
a light-emitting element comprising:
a first electrode provided over the insulating film;
a second electrode facing the first electrode; and
an EL layer provided between the first electrode and the second electrode;
a second adhesive layer provided over the second electrode; and
a second substrate provided over the second adhesive layer,
wherein the second substrate is a metal substrate, and
wherein a thickness of the second substrate is greater than or equal to 10 μm and less than or equal to 200 μm.

2. The flexible light-emitting device according to claim 1, further comprising a film sealing layer provided between the second electrode and the second adhesive layer.

3. The flexible light-emitting device according to claim 1, wherein the second substrate comprises at least one selected from the group consisting of stainless steel, aluminum, copper, nickel, and an aluminum alloy.

4. The flexible light-emitting device according to claim 1, wherein the first adhesive layer comprises at least one selected from the group consisting of an epoxy resin, an acrylic resin, a silicone resin, and a phenol resin.

5. The flexible light-emitting device according to claim 1, wherein the second adhesive layer comprises at least one selected from the group consisting of an epoxy resin, an acrylic resin, a silicone resin, and a phenol resin.

6. The flexible light-emitting device according to claim 1, further comprising a resin layer provided over the second substrate.

7. The flexible light-emitting device according to claim 6, wherein the resin layer comprises at least one selected from the group of an epoxy resin, an acrylic resin, a silicone resin, a phenol resin, a polyester resin, polypropylene, polyethylene, polycarbonate, polystyrene, polyamide, polyetherketone, a fluorine resin, and polyethylenenaphthalate.

8. The flexible light-emitting device according to claim 6, wherein the resin layer includes a fibrous body.

9. The flexible light-emitting device according to claim 1, wherein at least one of the first substrate, the first adhesive layer, and the second adhesive layer includes a fibrous body.

10. The flexible light-emitting device according to claim 1, further comprising a film having low permeability provided between the first substrate and the first adhesive layer.

11. The flexible light-emitting device according to claim 10, wherein the film having low permeability is a film containing silicon and nitrogen or a film containing aluminum and nitrogen.

12. The flexible light-emitting device according to claim 1, further comprising a coat film provided over a surface of the first substrate, which is opposite to a surface facing the second substrate.

13. The flexible light-emitting device according to claim 12, wherein the coat film has a light-transmitting property with respect to visible light and high hardness.

14. The flexible light-emitting device according to claim 12, wherein the coat film is a conductive film having a light-transmitting property with respect to visible light.

15. An electronic device using the flexible light-emitting device according to claim 1 for a display portion.

16. A flexible light-emitting device, comprising:
a first substrate having flexibility and a light-transmitting property with respect to visible light;
a first adhesive layer provided over the first substrate;
an insulating film containing nitrogen and silicon provided over the first adhesive layer;
a thin film transistor formation layer comprising a thin film transistor provided over the insulating film;
a light-emitting element comprising:
a first electrode electrically connected to the thin film transistor;
a second electrode facing the first electrode; and
an EL layer provided between the first electrode and the second electrode;
a second adhesive layer provided over the second electrode; and
a second substrate provided over the second adhesive layer,
wherein the second substrate is a metal substrate, and
wherein a thickness of the second substrate is greater than or equal to 10 μm and less than or equal to 200 μm.

17. The flexible light-emitting device according to claim 16, wherein an active layer of the thin film transistor formed in the thin film transistor formation layer comprises crystalline silicon.

18. The flexible light-emitting device according to claim 16,
wherein a pixel portion includes a plurality of the light-emitting elements,
wherein a driver circuit portion is provided outside the pixel portion, and
wherein the driver circuit portion includes a thin film transistor formed in the thin film transistor formation layer.

19. The flexible light-emitting device according to claim 16, further comprising a film sealing layer provided between the second electrode and the second adhesive layer.

20. The flexible light-emitting device according to claim 16,
wherein the second substrate comprises at least one selected from the group consisting of stainless steel, aluminum, copper, nickel, and an aluminum alloy.

21. The flexible light-emitting device according to claim 16,
wherein the first adhesive layer comprises at least one selected from the group consisting of an epoxy resin, an acrylic resin, a silicone resin, and a phenol resin.

22. The flexible light-emitting device according to claim 16,
wherein the second adhesive layer comprises at least one selected from the group consisting of an epoxy resin, an acrylic resin, a silicone resin, and a phenol resin.

23. The flexible light-emitting device according to claim 16, further comprising a resin layer provided over the second substrate.

24. The flexible light-emitting device according to claim 23, wherein the resin layer comprises at least one selected from the group of an epoxy resin, an acrylic resin, a silicone resin, a phenol resin, a polyester resin, polypropylene, polyethylene, polycarbonate, polystyrene, polyamide, polyetherketone, a fluorine resin, and polyethylenenaphthalate.

25. The flexible light-emitting device according to claim 23,
wherein the resin layer includes a fibrous body.

26. The flexible light-emitting device according to claim 16,
wherein at least one of the first substrate, the first adhesive layer, and the second adhesive layer includes a fibrous body.

27. The flexible light-emitting device according to claim 16, further comprising a film having low permeability provided between the first substrate and the first adhesive layer.

28. The flexibe light-emitting device according to claim 27, wherein the film having low permeability is a film containing silicon and nitrogen or a film containing aluminum and nitrogen.

29. The flexible light-emitting device according to claim 16, further comprising a coat film provided over a surface of the first substrate, which is opposite to a surface facing the second substrate.

30. The flexible light-emitting device according to claim 29, wherein the coat film has a light-transmitting property with respect to visible light and high hardness.

31. The flexible light-emitting device according to claim 29, wherein the coat film is a conductive film having a light-transmitting property with respect to visible light.

32. An electronic device using the flexible light-emitting device according to claim 16 for a display portion.

* * * * *

UNITED STATES PATENT AND TRADEMARK OFFICE
CERTIFICATE OF CORRECTION

PATENT NO. : 8,188,474 B2
APPLICATION NO. : 12/578687
DATED : May 29, 2012
INVENTOR(S) : Kaoru Hatano et al.

It is certified that error appears in the above-identified patent and that said Letters Patent is hereby corrected as shown below:

At column 6, line 15, "and:Dor" should be --and/or--;

At column 13, line 43, "atoms:Dem$^3$" should be --atoms/cm$^3$--;

At column 17, line 57, "polyethylenedioxythiophene:Dpolystyrenesulfonic" should be --polyethylenedioxythiophene/polystyrenesulfonic--;

At column 17, line 58, "PEDOT:DPSS" should be --PEDOT/PSS--;

At column 18, line 20, "10$^{-6}$cm$^2$:DVs" should be --10$^{-6}$cm$^2$/Vs--;

At column 18, line 56, "10-di(1-naphthypanthracene" should be --10-di(1-naphthyl)anthracene--;

At column 18, line 57, "10-di(2-naphthypanthracene" should be --10-di(2-naphthyl)anthracene--;

At column 18, line 64, "1X10$^{-6}$cm$^2$DVs" should be --1X10$^{-6}$cm$^2$/Vs--;

At column 19, line 21, "10$^{-6}$ cm$^2$:DVs" should be --10$^{-6}$ cm$^2$/Vs--;

At column 19, line 42, "YGA2 S" should be --YGA2S--;

At column 19, line 61, "2P CABPhA" should be --2PCABPhA--;

At column 20, line 8, "4-methylphenypacenaphtho" should be --4-methylphenyl)acenaphtho--;

At column 20, line 11, "quinolizin-9-ypethenyl" should be --quinolizin-9-yl)ethenyl--;

At column 20, line 14, "quinolizin-9-ypethenyl" should be --quinolizin-9-yl)ethenyl--;

At column 31, line 11, "10 ppm:DK" should be --10 ppm/K--;

At column 31, lines 14 and 15, "R2007-:DH-1010" should be --R2007/H-1010--;

At column 34, line 59, "ppm:DK" should be --ppm/K--;

At column 39, line 1, "flexibe" should be --flexible--.

Signed and Sealed this
Eleventh Day of September, 2012

David J. Kappos
*Director of the United States Patent and Trademark Office*